(12) United States Patent
Lewis et al.

(10) Patent No.: US 12,480,716 B2
(45) Date of Patent: Nov. 25, 2025

(54) THERMAL MANAGEMENT PLANES

(71) Applicant: Kelvin Thermal Technologies, Inc., Boulder, CO (US)

(72) Inventors: Ryan J. Lewis, Boulder, CO (US); Ronggui Yang, Broomfield, CO (US); Yung-Cheng Lee, Boulder, CO (US)

(73) Assignee: Kelvin Thermal Technologies, Inc., Boulder, CO (US)

( * ) Notice: Subject to any disclaimer, the term of this patent is extended or adjusted under 35 U.S.C. 154(b) by 588 days.

(21) Appl. No.: 17/529,248

(22) Filed: Nov. 17, 2021

(65) Prior Publication Data
US 2022/0074673 A1    Mar. 10, 2022

Related U.S. Application Data

(63) Continuation of application No. 15/974,306, filed on May 8, 2018, now abandoned.
(Continued)

(51) Int. Cl.
*F28D 15/02* (2006.01)
*F28D 15/04* (2006.01)
(Continued)

(52) U.S. Cl.
CPC ..... *F28D 15/0283* (2013.01); *F28D 15/0233* (2013.01); *F28D 15/04* (2013.01);
(Continued)

(58) Field of Classification Search
CPC ........... F28D 2015/0225; F28D 15/046; F28D 15/0241; F28D 15/04; F28D 15/0233;
(Continued)

(56) References Cited

U.S. PATENT DOCUMENTS

| 4,000,776 A | 1/1977 | Kroebig et al. |
| 4,274,479 A | 6/1981 | Eastman |

(Continued)

FOREIGN PATENT DOCUMENTS

| CN | 2522409 Y | 11/2002 |
| CN | 2715467 Y | 8/2005 |

(Continued)

OTHER PUBLICATIONS

International Preliminary Report on Patentability dated May 14, 2019 as received in PCT Application No. PCT/US2017/060550, 7 pages.

(Continued)

*Primary Examiner* — Devon Lane

(57) ABSTRACT

Some embodiments include a thermal management plane. The thermal management plane may include a top casing comprising a polymer material; a top encapsulation layer disposed on the top casing; a bottom casing comprising a polymer material; a bottom encapsulation layer disposed on the bottom casing; a hermetical seal coupling the bottom casing with the top casing; a wicking layer disposed between the bottom casing and the top casing; and a plurality of spacers disposed between the top casing and the bottom casing within the vacuum core, wherein each of the plurality of spacers have a low thermal conduction. In some embodiments, the thermal management plane has a thickness less than about 200 microns.

20 Claims, 38 Drawing Sheets

Related U.S. Application Data

(60) Provisional application No. 62/503,080, filed on May 8, 2017.

(51) Int. Cl.
*H01L 23/427* (2006.01)
*H05K 7/20* (2006.01)

(52) U.S. Cl.
CPC ....... *H01L 23/427* (2013.01); *H05K 7/20336* (2013.01); *F28D 15/0241* (2013.01); *F28F 2265/00* (2013.01)

(58) Field of Classification Search
CPC .............. F28D 15/0283; F28F 2265/00; H05K 7/20336; H01L 23/427
See application file for complete search history.

(56) References Cited

U.S. PATENT DOCUMENTS

| | | | |
|---|---|---|---|
| 4,279,294 A | | 7/1981 | Fitzpatrick et al. |
| 4,545,799 A | | 10/1985 | Rhodes et al. |
| 4,854,379 A | | 8/1989 | Shaubach et al. |
| 5,000,256 A | | 3/1991 | Tousignant |
| 5,157,893 A | | 10/1992 | Benson et al. |
| 5,175,975 A | | 1/1993 | Benson et al. |
| 5,343,940 A | | 9/1994 | Jean |
| 5,360,058 A | * | 11/1994 | Koeppl ................. F28D 15/046 165/274 |
| 5,560,423 A | | 10/1996 | Larson et al. |
| 5,735,339 A | | 4/1998 | Davenport et al. |
| 6,056,044 A | | 5/2000 | Benson et al. |
| 6,082,443 A | | 7/2000 | Yamamoto et al. |
| 6,139,974 A | | 10/2000 | Atkinson et al. |
| 6,158,502 A | | 12/2000 | Thomas |
| 6,269,866 B1 | | 8/2001 | Yamamoto et al. |
| 6,446,706 B1 | | 9/2002 | Rosenfeld et al. |
| 6,533,029 B1 | | 3/2003 | Phillips |
| 6,561,262 B1 | * | 5/2003 | Osakabe ................. F28F 1/40 165/104.21 |
| 6,763,671 B1 | | 7/2004 | Klett et al. |
| 6,896,039 B2 | | 5/2005 | Dussinger et al. |
| 6,912,130 B2 | | 6/2005 | Osanai et al. |
| 6,938,481 B2 | | 9/2005 | Paterek et al. |
| 6,994,151 B2 | | 2/2006 | Zhou et al. |
| 7,028,713 B2 | | 4/2006 | Koyama |
| 7,037,400 B1 | | 5/2006 | Shaw et al. |
| 7,069,978 B2 | | 7/2006 | Rosenfeld et al. |
| 7,100,680 B2 | | 9/2006 | Dussinger et al. |
| 7,278,469 B2 | | 10/2007 | Sasaki et al. |
| 8,018,128 B2 | | 9/2011 | Egawa et al. |
| 8,069,907 B2 | | 12/2011 | Bryant et al. |
| 8,579,018 B1 | | 11/2013 | Roper et al. |
| 8,646,281 B2 | | 2/2014 | Lim |
| 8,807,203 B2 | | 8/2014 | MacDonald et al. |
| 8,921,702 B1 | | 12/2014 | Carter et al. |
| 8,985,197 B2 | | 3/2015 | Wang |
| 9,163,883 B2 | | 10/2015 | Yang et al. |
| 9,651,312 B2 | | 5/2017 | Yang et al. |
| 9,700,930 B2 | | 7/2017 | Yang |
| 9,835,383 B1 | * | 12/2017 | Roper ..................... B23P 15/26 |
| 9,909,814 B2 | | 3/2018 | Yang et al. |
| 9,921,004 B2 | | 3/2018 | Lewis et al. |
| 10,066,876 B2 | | 9/2018 | Zhou et al. |
| 10,281,220 B1 | | 5/2019 | Lin et al. |
| 10,458,719 B2 | | 10/2019 | Bozorgi et al. |
| 10,527,358 B2 | | 1/2020 | Yang et al. |
| 10,544,994 B2 | | 1/2020 | Wakaoka et al. |
| 10,571,200 B2 | | 2/2020 | Yang et al. |
| 10,973,151 B2 | | 4/2021 | Wakaoka et al. |
| 10,980,148 B2 | | 4/2021 | Cheng |
| 11,054,189 B2 | | 7/2021 | Salim Shirazy et al. |
| 11,054,190 B2 | | 7/2021 | Inagaki et al. |
| 11,058,031 B2 | | 7/2021 | Numoto et al. |
| 11,150,030 B2 | | 10/2021 | Kishimoto et al. |
| 11,445,636 B2 | | 9/2022 | Wakaoka et al. |
| 2001/0054495 A1 | | 12/2001 | Yevin et al. |
| 2003/0042009 A1 | | 3/2003 | Phillips |
| 2003/0079863 A1 | * | 5/2003 | Sugito ................... H05K 7/1418 257/E23.098 |
| 2003/0102118 A1 | | 6/2003 | Sagal et al. |
| 2003/0136547 A1 | | 7/2003 | Gollan et al. |
| 2003/0136550 A1 | | 7/2003 | Tung et al. |
| 2003/0136551 A1 | | 7/2003 | Bakke |
| 2003/0159806 A1 | | 8/2003 | Sehmbey et al. |
| 2004/0011509 A1 | | 1/2004 | Siu |
| 2004/0050533 A1 | | 3/2004 | Chessar et al. |
| 2004/0131877 A1 | | 7/2004 | Hasz et al. |
| 2004/0134548 A1 | | 7/2004 | Koyama |
| 2004/0244951 A1 | | 12/2004 | Dussinger et al. |
| 2005/0059238 A1 | | 3/2005 | Chen et al. |
| 2005/0126757 A1 | | 6/2005 | Bennett et al. |
| 2005/0190810 A1 | | 9/2005 | Butterworth et al. |
| 2005/0230085 A1 | | 10/2005 | Valenzuela |
| 2005/0280128 A1 | | 12/2005 | Mok et al. |
| 2005/0280162 A1 | | 12/2005 | Mok et al. |
| 2006/0032615 A1 | | 2/2006 | Dussinger et al. |
| 2006/0037737 A1 | | 2/2006 | Chen et al. |
| 2006/0090882 A1 | | 5/2006 | Sauciuc |
| 2006/0098411 A1 | | 5/2006 | Lee et al. |
| 2006/0124280 A1 | | 6/2006 | Lee et al. |
| 2006/0131002 A1 | | 6/2006 | Mochizuki et al. |
| 2006/0196640 A1 | | 9/2006 | Siu |
| 2006/0196641 A1 | | 9/2006 | Hong et al. |
| 2006/0213648 A1 | | 9/2006 | Chen et al. |
| 2006/0283574 A1 | | 12/2006 | Huang |
| 2006/0283576 A1 | | 12/2006 | Lai et al. |
| 2007/0006993 A1 | | 1/2007 | Meng et al. |
| 2007/0035927 A1 | | 2/2007 | Erturk et al. |
| 2007/0056714 A1 | | 3/2007 | Wong |
| 2007/0068657 A1 | | 3/2007 | Yamamoto et al. |
| 2007/0077165 A1 | | 4/2007 | Hou et al. |
| 2007/0089864 A1 | | 4/2007 | Chang et al. |
| 2007/0107875 A1 | | 5/2007 | Lee et al. |
| 2007/0107878 A1 | * | 5/2007 | Hou ...................... F28D 15/046 165/104.26 |
| 2007/0158050 A1 | | 7/2007 | Norley et al. |
| 2008/0017356 A1 | | 1/2008 | Gruss et al. |
| 2008/0029249 A1 | | 2/2008 | Hsiao |
| 2008/0067502 A1 | | 3/2008 | Chakrapani et al. |
| 2008/0111151 A1 | | 5/2008 | Teraki et al. |
| 2008/0128116 A1 | | 6/2008 | Dangelo et al. |
| 2008/0128898 A1 | | 6/2008 | Henderson et al. |
| 2008/0210407 A1 | | 9/2008 | Kim et al. |
| 2008/0224303 A1 | | 9/2008 | Funakoshi et al. |
| 2008/0272482 A1 | | 11/2008 | Jensen et al. |
| 2008/0283222 A1 | | 11/2008 | Chang et al. |
| 2009/0020272 A1 | | 1/2009 | Shimizu |
| 2009/0025910 A1 | | 1/2009 | Hoffman et al. |
| 2009/0056917 A1 | | 3/2009 | Majumdar et al. |
| 2009/0151906 A1 | | 6/2009 | Lai et al. |
| 2009/0159242 A1 | | 6/2009 | Zhao et al. |
| 2009/0205812 A1 | | 8/2009 | Meyer, IV et al. |
| 2009/0236080 A1 | | 9/2009 | Lin et al. |
| 2009/0294104 A1 | | 12/2009 | Lin et al. |
| 2009/0316335 A1 | | 12/2009 | Simon et al. |
| 2010/0028604 A1 | | 2/2010 | Bhushan et al. |
| 2010/0053899 A1 | | 3/2010 | Hashimoto et al. |
| 2010/0071879 A1 | | 3/2010 | Hou |
| 2010/0084113 A1 | | 4/2010 | Lee |
| 2010/0139767 A1 | | 6/2010 | Hsieh et al. |
| 2010/0157535 A1 | | 6/2010 | Oniki et al. |
| 2010/0200199 A1 | | 8/2010 | Habib et al. |
| 2010/0252237 A1 | * | 10/2010 | Hashimoto ........... H01L 23/427 165/104.21 |
| 2010/0254090 A1 | | 10/2010 | Trautman |
| 2010/0290190 A1 | | 11/2010 | Chester et al. |
| 2010/0294200 A1 | | 11/2010 | Zhang et al. |
| 2010/0300656 A1 | | 12/2010 | Lu et al. |
| 2011/0017431 A1 | | 1/2011 | Yang et al. |
| 2011/0027311 A1 | | 2/2011 | Deng et al. |
| 2011/0083829 A1 | | 4/2011 | Hung et al. |
| 2011/0088873 A1 | | 4/2011 | Yang |
| 2011/0108142 A1 | | 5/2011 | Liu et al. |

(56) References Cited

U.S. PATENT DOCUMENTS

| | | | |
|---|---|---|---|
| 2011/0120674 A1 | 5/2011 | MacDonald et al. | |
| 2011/0174474 A1 | 7/2011 | Liu et al. | |
| 2011/0198059 A1 | 8/2011 | Gavillet et al. | |
| 2011/0205708 A1 | 8/2011 | Andry et al. | |
| 2012/0037210 A1 | 2/2012 | Lim | |
| 2012/0061127 A1 | 3/2012 | Fields et al. | |
| 2012/0168435 A1 | 7/2012 | Chen et al. | |
| 2012/0186784 A1 | 7/2012 | Yang et al. | |
| 2012/0189839 A1 | 7/2012 | Aoki et al. | |
| 2012/0241216 A1 | 9/2012 | Coppeta et al. | |
| 2012/0312504 A1* | 12/2012 | Suzuki | F25B 39/04 62/190 |
| 2013/0043000 A1 | 2/2013 | Wang | |
| 2013/0049018 A1 | 2/2013 | Ramar et al. | |
| 2013/0168057 A1 | 7/2013 | Semenic et al. | |
| 2013/0199770 A1 | 8/2013 | Cherian | |
| 2013/0269913 A1 | 10/2013 | Ueda et al. | |
| 2013/0327504 A1 | 12/2013 | Bozorgi et al. | |
| 2014/0009883 A1 | 1/2014 | Fujiwara et al. | |
| 2014/0017456 A1 | 1/2014 | Xiao et al. | |
| 2014/0055954 A1 | 2/2014 | Wu | |
| 2014/0174700 A1 | 6/2014 | Lin et al. | |
| 2014/0174701 A1 | 6/2014 | Kare et al. | |
| 2014/0237823 A1 | 8/2014 | Yang | |
| 2014/0238645 A1 | 8/2014 | Enright | |
| 2014/0238646 A1 | 8/2014 | Enright | |
| 2014/0247556 A1 | 9/2014 | Eid et al. | |
| 2015/0181756 A1 | 6/2015 | Sato et al. | |
| 2015/0226493 A1 | 8/2015 | Yang et al. | |
| 2015/0237762 A1 | 8/2015 | Holt et al. | |
| 2015/0289413 A1 | 10/2015 | Rush et al. | |
| 2016/0018165 A1 | 1/2016 | Ahamed et al. | |
| 2016/0076820 A1* | 3/2016 | Lewis | H01L 23/427 165/104.26 |
| 2016/0081227 A1 | 3/2016 | Lee et al. | |
| 2016/0123678 A1 | 5/2016 | Hulse et al. | |
| 2016/0131437 A1 | 5/2016 | Wu | |
| 2016/0161193 A1* | 6/2016 | Lewis | B23P 15/26 216/13 |
| 2016/0216042 A1 | 7/2016 | Bozorgi et al. | |
| 2016/0343639 A1 | 11/2016 | Groothuis et al. | |
| 2017/0030654 A1 | 2/2017 | Yang et al. | |
| 2017/0064868 A1 | 3/2017 | Rush et al. | |
| 2017/0122672 A1 | 5/2017 | Lin | |
| 2017/0241717 A1* | 8/2017 | Sun | F28D 15/046 |
| 2017/0318702 A1* | 11/2017 | Basu | G06F 1/203 |
| 2017/0343293 A1* | 11/2017 | Hurbi | F28F 21/087 |
| 2017/0350657 A1* | 12/2017 | Yeh | F28D 15/046 |
| 2018/0010861 A1 | 1/2018 | Wakoaka et al. | |
| 2018/0106554 A1 | 4/2018 | Lewis et al. | |
| 2018/0320984 A1 | 11/2018 | Lewis et al. | |
| 2019/0271511 A1 | 9/2019 | Kishimoto et al. | |
| 2019/0390919 A1* | 12/2019 | Lewis | B81B 1/00 |
| 2020/0003501 A1 | 1/2020 | Wakaoka | |
| 2020/0045847 A1 | 2/2020 | Wakoaka et al. | |
| 2020/0045848 A1 | 2/2020 | Wakoaka et al. | |
| 2020/0049421 A1 | 2/2020 | Wakoaka et al. | |
| 2020/0060044 A1 | 2/2020 | Numoto et al. | |
| 2020/0124352 A1 | 4/2020 | Wakoaka et al. | |
| 2020/0240718 A1 | 7/2020 | Wakoaka et al. | |
| 2021/0025061 A1 | 1/2021 | Yang et al. | |
| 2021/0136955 A1 | 5/2021 | Wakoaka et al. | |
| 2021/0148646 A1 | 5/2021 | Sun et al. | |
| 2022/0120510 A1 | 4/2022 | Wu et al. | |
| 2022/0128314 A1 | 4/2022 | Inagaki et al. | |

FOREIGN PATENT DOCUMENTS

| | | | |
|---|---|---|---|
| CN | 1672258 A | 9/2005 | |
| CN | 1877241 A | 12/2006 | |
| CN | 1957221 A | 5/2007 | |
| CN | 101022718 A | 8/2007 | |
| CN | 101080359 A | 11/2007 | |
| CN | 101151950 A | 3/2008 | |
| CN | 100480611 C | 4/2009 | |
| CN | 100508708 C | 7/2009 | |
| CN | 101754656 A | 6/2010 | |
| CN | 102019543 A | 4/2011 | |
| CN | 102066864 A | 5/2011 | |
| CN | 202928418 U | 5/2013 | |
| CN | 103398613 A | 11/2013 | |
| CN | 103952729 A | 7/2014 | |
| DE | 19729922 C1 | 1/1999 | |
| DE | 202009016739 U1 | 4/2010 | |
| EP | 1369918 A2 | 12/2003 | |
| EP | 2713132 A1 | 4/2014 | |
| GB | 2529512 A | 2/2016 | |
| JP | H1197871 A | 4/1999 | |
| JP | 2011080679 A | 4/2011 | |
| JP | 2013148289 A | 8/2013 | |
| WO | 03103835 A1 | 12/2003 | |
| WO | 2006052763 A2 | 5/2006 | |
| WO | 2006115326 A1 | 11/2006 | |
| WO | 2006123049 A2 | 11/2006 | |
| WO | 2007124028 A2 | 11/2007 | |
| WO | 2008044823 A1 | 4/2008 | |
| WO | 2008045004 A1 | 4/2008 | |
| WO | 2008146129 A2 | 12/2008 | |
| WO | 2009079084 A1 | 6/2009 | |
| WO | 2010036442 A1 | 4/2010 | |
| WO | 2013144444 A1 | 10/2013 | |
| WO | 2015172136 A1 | 11/2015 | |
| WO | 2015193153 A1 | 12/2015 | |
| WO | 2016044180 A1 | 3/2016 | |

OTHER PUBLICATIONS

Final Office Action dated May 28, 2019 in U.S. Appl. No. 15/436,632, 14 pages.

Advisory Action dated Jul. 19, 2019 in U.S. Appl. No. 15/292,932, 4 pages.

Advisory Action dated Aug. 22, 2019 in U.S. Appl. No. 15/787,455, 4 pages.

Final Office Action dated Aug. 26, 2019 in U.S. Appl. No. 14/857,567, 27 pages.

Notice of Allowance dated Sep. 12, 2019 in U.S. Appl. No. 15/292,932, 7 pages.

Non-Final Office Action dated Sep. 17, 2019 in U.S. Appl. No. 15/787,455, 20 pages.

Notice of Allowance dated Oct. 10, 2019 in U.S. Appl. No. 15/436,632, 10 pages.

Final Office Action dated Oct. 11, 2019 in U.S. Appl. No. 15/806,723, 18 pages.

Advisory Action dated Nov. 7, 2019 in U.S. Appl. No. 14/857,567, 7 pages.

International Preliminary Report on Patentability dated Nov. 12, 2019 received in PCT Application No. PCT/US2018/031632, 7 pages.

Non-Final Office Action dated Nov. 29, 2019 in U.S. Appl. No. 14/857,567, 32 pages.

Advisory Action dated Feb. 3, 2020 in U.S. Appl. No. 15/806,723, 5 pages.

Restriction Requirement dated Feb. 13, 2020 in U.S. Appl. No. 15/974,306, 5 pages.

Final Office Action dated Feb. 18, 2020 in U.S. Appl. No. 15/787,455, 17 pages.

Office Action mailed Feb. 18, 2020, as received in EP Application No. 15841403.7, 4 pages.

Non-Final Office Action dated Mar. 18, 2020 in U.S. Appl. No. 15/806,723, 6 pages.

International Search Report and Written Opinion dated Apr. 8, 2020 as received in PCT Application No. PCT/US2019/065701, 16 pages.

Office Action mailed Apr. 9, 2020, as received in EP Application No. 15842101.6, 7 pages.

Notice of Allowance dated Apr. 15, 2020 in U.S. Appl. No. 14/857,567, 13 pages.

Notice of Allowance dated Apr. 20, 2020 in U.S. Appl. No. 15/806,723, 8 pages.

(56) References Cited

OTHER PUBLICATIONS

Advisory Action dated May 1, 2020 in U.S. Appl. No. 15/787,455, 4 pages.
Non-Final Office Action dated May 29, 2020 in U.S. Appl. No. 15/974,306, 11 pages.
First Office Action received Jun. 1, 2020, in related CN application No. 201910233277.1, 18 Pages.
First Office Action mailed Jun. 4, 2020, as received in CN Application No. 201580050472, 15 pages.
Extended European search report Application mailed Jun. 12, 2020, as received in EP Application No. 17870153.8, 9 pages.
International Search Report and Written Opinion Application mailed Jul. 13, 2020, as received in PCT Application No. PCT/US2020/030911, 9 pages.
First Office Action mailed Jul. 24, 2020, as received in CN Application No. 201910754250, 19 pages.
First Office Action mailed Sep. 24, 2020, as received in CN Application No. 201880030856, 19 pages.
Restriction Requirement dated Oct. 14, 2020 in U.S. Appl. No. 16/539,848, 8 pages.
Non-Final Office Action dated Oct. 26, 2020 in U.S. Appl. No. 16/539,848, 13 pages.
Office Action mailed Nov. 18, 2020, as received in EP Application No. 15841403.7, 5 pages.
Office Action mailed Nov. 17, 2020, as received in EP Application No. 15842101.6, 5 pages.
Extended European search report Application mailed Dec. 16, 2020, as received in EP Application No. 18798835.7, 8 pages.
Final Office Action dated Jan. 11, 2021 in U.S. Appl. No. 15/974,306, 12 pages.
Final Office Action dated Feb. 2, 2021 in U.S. Appl. No. 16/539,848, 10 pages.
Second Office Action mailed Mar. 16, 2021, as received in CN Application No. 201910233277.1, 21 pages.
Advisory Action dated Apr. 9, 2021 in U.S. Appl. No. 16/539,848, 4 pages.
Restriction Requirement dated Apr. 9, 2021 in U.S. Appl. No. 16/710,180, 8 pages.
Advisory Action dated Apr. 16, 2021 in U.S. Appl. No. 15/974,306, 4 pages.
Third Office Action mailed Apr. 19, 2021, as received in CN Application No. 201580049534, 7 pages.
Non-Final Office Action dated May 11, 2021 in U.S. Appl. No. 16/539,848, 10 pages.
Non-Final Office Action dated May 17, 2021 in U.S. Appl. No. 15/974,306, 9 pages.
International Preliminary Report on Patentability dated Jun. 8, 2021 as received in PCT Application No. PCT/ JS2019/065701, 7 pages.
Restriction Requirement dated Jun. 9, 2021 in U.S. Appl. No. 16/680,480, 6 pages.
Non-Final Office Action dated Jul. 9, 2021 in U.S. Appl. No. 15/930,016, 18 pages.
Restriction Requirement dated Jul. 19, 2021 in U.S. Appl. No. 16/710,180, 7 pages.
Restriction Requirement dated Aug. 30, 2021 in U.S. Appl. No. 17/352,250, 7 pages.
Notice of Allowance dated Sep. 9, 2021 in U.S. Appl. No. 15/787,455, 8 pages.
International Search Report and Written Opinion in PCT Application No. PCT/US2021/038152 mailed on Sep. 29, 2021, 14 pages.
Non-Final Office Action dated Oct. 5, 2021 in U.S. Appl. No. 16/680,480, 12 pages.
Non-Final Office Action dated Nov. 5, 2021 in U.S. Appl. No. 17/352,250, 17 pages.
Non-Final Office Action dated Nov. 8, 2021 in U.S. Appl. No. 15/787,455, 17 pages.
Final Office Action dated Nov. 29, 2021 in U.S. Appl. No. 16/539,848, 11 pages.
Non-Final Office Action dated Dec. 13, 2021 in U.S. Appl. No. 16/710,180, 14 pages.
Final Office Action dated Dec. 17, 2021 in U.S. Appl. No. 15/930,016, 19 pages.
Restriction Requirement in U.S. Appl. No. 16/864,236 dated Feb. 7, 2022, 8 pages.
Advisory Action dated Feb. 9, 2022 in U.S. Appl. No. 16/539,848, 4 pages.
Final Office Action dated Feb. 24, 2022 in U.S. Appl. No. 15/787,455, 24 pages.
Notice of Allowance dated Feb. 28, 2022 in U.S. Appl. No. 16/680,480, 9 pages.
Final Office Action dated Mar. 11, 2022 in U.S. Appl. No. 17/352,250, 17 pages.
Non-Final Office Action dated Mar. 28, 2022 in U.S. Appl. No. 16/539,848, 11 pages.
Final Office Action dated Apr. 7, 2022 in U.S. Appl. No. 16/710,180, 15 pages.
Restriction Requirement dated Jul. 23, 2012 in U.S. Appl. No. 12/719,775, 9 pages.
Non-Final Office Action dated Nov. 9, 2012 in U.S. Appl. No. 12/719,775, 15 pages.
Final Office Action dated May 9, 2013 in U.S. Appl. No. 12/719,775, 15 pages.
Advisory Action dated Aug. 2, 2013 in U.S. Appl. No. 12/719,775, 4 pages.
Non-Final Office Action dated Oct. 2, 2013 in U.S. Appl. No. 12/719,775, 17 pages.
Final Office Action dated Mar. 26, 2014 in U.S. Appl. No. 12/719,775, 23 pages.
Advisory Action dated Jun. 20, 2014 in U.S. Appl. No. 12/719,775, 4 pages.
Non-Final Office Action dated Feb. 6, 2015 in U.S. Appl. No. 12/719,775, 24 pages.
Restriction Requirement dated Jul. 28, 2015 in U.S. Appl. No. 14/681,624, 5 pages.
Notice of Allowance in dated Aug. 4, 2015 U.S. Appl. No. 12/719,775, 9 pages.
Non-Final Office Action dated Oct. 23, 2015 in U.S. Appl. No. 14/681,624, 11 pages.
International Search Report and Written Opinion dated Dec. 18, 2015 as received in PCT Application No. PCT/US2015/050031, 13 pages.
International Search Report and Written Opinion dated Dec. 18, 2015 as received in PCT Application No. PCT/US2015/050771, 13 pages.
Final Office Action dated May 5, 2016 in U.S. Appl. No. 14/681,624, 11 pages.
International Search Report and Written Opinion mailed dated Jul. 15, 2016 as received in PCT Application No. PCT/US2015/057885, 10 pages.
Notice of Allowance dated Nov. 17, 2016 in U.S. Appl. No. 14/681,624, 7 pages.
International Preliminary Report on Patentability dated Mar. 21, 2017 as received in PCT Application No. PCT/US2015/050031, 8 pages.
International Preliminary Report on Patentability dated Mar. 21, 2017 as received in PCT Application No. PCT/US2015/050771, 6 pages.
International Preliminary Report on Patentability dated May 2, 2017 as received in PCT Application No. PCT/US2015/057885, 5 pages.
Preinterview First Office Action dated May 9, 2017 in U.S. Appl. No. 14/861,708, 9 pages.
Non-Final Office Action dated Aug. 9, 2017 in U.S. Appl. No. 14/925,787, 16 pages.
Restriction Requirement dated Aug. 30, 2017 in U.S. Appl. No. 14/853,833, 7 pages.
Final Office Action dated Sep. 28, 2017 in U.S. Appl. No. 14/925,787, 9 pages.
Non-Final Office Action dated Oct. 6, 2017 in U.S. Appl. No. 14/853,833, 13 pages.
Notice of Allowance dated Oct. 25, 2017 in U.S. Appl. No. 14/861,708, 9 pages.
US Notice of Allowance dated Nov. 9, 2017 in U.S. Appl. No. 14/925,787, 7 pages.

(56) References Cited

OTHER PUBLICATIONS

Preinterview First Office Action dated Nov. 21, 2017 in U.S. Appl. No. 14/857,567, 12 pages.
International Search Report and Written Opinion mailed dated Jan. 17, 2018 as received in PCT Application No. PCT/US2017/060550, 13 pages.
Extended European search report Application mailed Feb. 22, 2018, as received in EP Application No. 15842101.6, 7 pages.
Final Office Action dated Mar. 8, 2018 in U.S. Appl. No. 14/857,567, 25 pages.
Extended European search report mailed Mar. 26, 2018, as received in EP Application No. 15841403.7, 10 pages.
Final Office Action dated Apr. 25, 2018 in U.S. Appl. No. 14/853,833, 12 pages.
First Office Action mailed May 9, 2018, as received in CN Application No. 201580049534, 13 pages.
Advisory Action dated May 30, 2018 in U.S. Appl. No. 14/857,567, 7 pages.
Non-Final Office Action dated Aug. 2, 2018 in U.S. Appl. No. 14/857,567, 30 pages.
First Office Action mailed Aug. 28, 2018, as received in CN Application No. 201580059333, 10 pages.
Restriction Requirement dated Aug. 30, 2018 in U.S. Appl. No. 15/292,932, 5 pages.
Non-Final Office Action dated Sep. 27, 2018 in U.S. Appl. No. 15/787,455, 15 pages.
Restriction Requirement dated Oct. 10, 2018 in U.S. Appl. No. 15/436,632, 5 pages.
International Search Report and Written Opinion mailed dated Oct. 15, 2018 received in PCT Application No. PCT/US2018/031632, 15 pages.
Final Office Action dated Oct. 30, 2018 in U.S. Appl. No. 14/857,567, 28 pages.
Non-Final Office Action dated Nov. 19, 2018 in U.S. Appl. No. 14/853,833, 11 pages.
Non-Final Office Action dated Dec. 11, 2018 in U.S. Appl. No. 15/292,932, 13 pages.
Second Office Action mailed Dec. 29, 2018, as received in CN Application No. 201580049534, 14 pages.
Non-Final Office Action dated Feb. 5, 2019 in U.S. Appl. No. 15/436,632, 10 pages.
Non-Final Office Action dated Mar. 21, 2019 in U.S. Appl. No. 14/857,567, 28 pages.
Final Office Action dated Mar. 29, 2019 in U.S. Appl. No. 14/853,833, 12 pages.
Final Office Action dated Mar. 29, 2019 in U.S. Appl. No. 15/292,932, 13 pages.
Final Office Action dated Apr. 1, 2019 in U.S. Appl. No. 15/787,455, 20 pages.
Non-Final Office Action dated Apr. 5, 2019 in U.S. Appl. No. 15/806,723, 12 pages.
China Office Action in CN Application No. 201780082663.4 dated Sep. 20, 2022, 22 pages.
Non-Final Office Action in U.S. Appl. No. 16/864,236 dated Oct. 6, 2022, 11 pages.
Advisory Action in U.S. Appl. No. 16/710,180 dated Sep. 23, 2022, 3 pages.
Final Office Action in U.S. Appl. No. 16/710,180 dated Nov. 14, 2022, 14 pages.
Advisory Action in U.S. Appl. No. 16/539,848 dated Nov. 28, 2022, 3 pages.
Final Office Action in U.S. Appl. No. 16/539,848 dated Sep. 13, 2022, 11 pages.
Non-Final Office Action in U.S. Appl. No. 16/539,848 dated Dec. 29, 2022, 12 pages.
Non-Final Office Action in U.S. Appl. No. 15/930,016 dated Jul. 27, 2022, 16 pages.
Notice of Allowance in U.S. Appl. No. 15/930,016 dated Dec. 1, 2022, 9 pages.

\* cited by examiner

THERMAL MANAGEMENT PLANES

BACKGROUND

Thermal management can include any number of processes and/or devices. In electronics, thermal management typically includes the transfer of heat from one area to another area. Typical thermal management has included fans and various other large mechanical devices. The miniaturization of devices such as mobile phones, watches, tablets, wearables, power electronics, power amplifiers, batteries, electric vehicles, etc., requires more nuanced thermal management techniques. There is a need for thin yet effective thermal management devices.

SUMMARY

Some embodiments include a thermal management plane comprising: a top casing that is hermetically sealed and bondable with copper; a bottom casing that is hermetically sealed and bondable with copper; and a copper seal between the top casing and the bottom casing created by sintering a plurality of copper nanoparticles disposed between the top casing and the bottom casing at a temperature between 200° C. and 300° C.

In some embodiments, the top casing comprises a non-copper layer encapsulated with a copper layer. In some embodiments, the top casing comprises a polymer encapsulated with a copper layer.

In some embodiments, the thermal management plane may include a mesh layer disposed between the top casing and the bottom casing.

In some embodiments, either or both the top casing and the bottom casing comprise a plurality of pillars.

In some embodiments, the thermal management plane may include a plurality of support structures placed between the top casing and the bottom casing.

In some embodiments, the copper seal is disposed at least around the perimeter of both the top casing and the bottom casing.

In some embodiments, the thermal management plane may include an isolated vacuum cavity disposed within the thermal management plane.

In some embodiments, the thermal management plane may include a working fluid disposed between the top casing and the bottom casing.

In some embodiments, the thermal management plane may include a vacuum chamber formed between the top casing and the bottom casing.

In some embodiments, the thermal management plane has a thickness less than about 200 microns.

In some embodiments, the thermal management plane may include a plurality of spacers disposed between the top casing and the bottom casing and the plurality of spacers comprising a low-thermal conductivity material disposed.

Some embodiments may include a method for manufacturing a plurality of thermal management planes. The method may include disposing a first top layer within a press on a first press member, the first top layer comprising a casing and a plurality of pillars; disposing a first bottom layer within the press relative to the second top layer; disposing a first plurality of nanoparticles between the first top layer and the first bottom layer; disposing a second press member within the press on the first bottom layer; disposing a second top layer within the press on the second press member, the second top layer comprising a casing and a plurality of pillars; disposing a second bottom layer within the press relative to the second top layer; disposing a second plurality of nanoparticles between the second top layer and the second bottom layer; disposing a third press member within the press on the second bottom layer; and heating at least the first plurality of nanoparticles and the second plurality of nanoparticles to a temperature between 200° C. and 300° C.; and applying pressure between the third press member and the first press member.

In some embodiments, the thermal management plane may include the first press member is shaped and configured to apply pressure on the perimeter of the first top layer when the pressure is applied between the third press member and the first press member. In some embodiments, the second press member is shaped and configured to apply pressure on the perimeter of the first bottom layer and the second top layer when the pressure is applied between the third press member and the first press member. In some embodiments, the third press member is shaped and configured to apply pressure on the perimeter of the second bottom layer when the pressure is applied between the third press member and the first press member.

The method may also include disposing a first mesh between the first top layer and the first bottom layer; and disposing a second mesh between the second top layer and the second bottom layer.

In some embodiments, the first plurality of nanoparticles and/or the second plurality of nanoparticles comprise copper.

In some embodiments, the first bottom layer comprises a casing and a plurality of pillars; and the second bottom layer comprises a casing and a plurality of pillars.

In some embodiments, the first plurality of nanoparticles are disposed on the perimeter of either or both the first top layer and the first bottom layer, and wherein the second plurality of nanoparticles are disposed on the perimeter of either or both the second top layer and the second bottom layer.

Some embodiments include a thermal management plane. The thermal management plane may include a top casing comprising a hermetically sealed polymer material; a top encapsulation layer disposed on the top casing; a bottom casing comprising a hermetically sealed polymer material; a bottom encapsulation layer disposed on the bottom casing; a hermetical seal coupling the bottom casing with the top casing; a wicking layer disposed between the bottom casing and the top casing; and a plurality of spacers disposed between the top casing and the bottom casing within the vacuum core, wherein each of the plurality of spacers have a low thermal conduction. In some embodiments, the thermal management plane has a thickness less than about 200 microns.

In some embodiments, the top encapsulation and/or the bottom encapsulation has a thickness less than about 50 microns.

In some embodiments, the hermetic seal is created at a temperature less than about 300° C.

In some embodiments, the hermetical seal comprises sintered nanoparticles along the perimeter of either or both the top casing and the bottom casing.

In some embodiments, the nanoparticles comprise copper nanoparticles or silver nanoparticles.

In some embodiments, the top encapsulation and/or the bottom encapsulation comprises copper.

In some embodiments, the plurality of spacers comprise a low-thermal conductivity material disposed on either or both the top casing and the bottom casing.

In some embodiments, the wicking layer comprises a plurality of pillars where the pillars include a cap.

In some embodiments, the wicking layer is created by electroplating through a template configured with microscaled sacrificial spacers disposed on a macro-scaled sacrificial layer.

In some embodiments, the wicking layer is created using a 2-step etching process of isotropic etching and anisotropic etching.

In some embodiments, the wicking layer comprises a pre-patterned array of caps and/or a pre-patterned array of pillars.

In some embodiments, the thermal management plane may include a plurality of arteries.

In some embodiments, the thermal management plane may include a gas reservoir to collect non-condensable gases.

Some embodiments may include a thermal management plane. The thermal management plane may include a top casing comprising a polymer material; a top encapsulation layer disposed on the top casing; a bottom casing comprising a polymer material; a hermetical seal coupling the bottom casing with the top casing; a wicking layer disposed between the bottom casing and the top casing; and a plurality of spacers disposed between the top casing and the bottom casing within the vacuum core, wherein each of the plurality of spacers have a low thermal conduction. In some embodiments, the thermal management plane has a thickness less than about 200 microns.

In some embodiments, a defect in the top encapsulation layer may be filled with one or more metal nanoparticles.

In some embodiments, each of the plurality of nanoparticles comprise a plurality of hydrophobic tails.

In some embodiments, a defect in the top encapsulation layer may be filled with an electroplated metal.

Some embodiments may include a thermal management plane. The thermal management plane may include a top casing comprising a polymer material; a top encapsulation layer disposed on the top casing; a bottom casing comprising a polymer material; a bottom encapsulation layer disposed on the bottom casing; a hermetical seal coupling the bottom casing with the top casing; a vacuum core formed between the top casing and the bottom casing; and a plurality of spacers disposed between the top casing and the bottom casing within the vacuum core, wherein each of the plurality of spacers have a low thermal conduction. In some embodiments, the thermal management plane has a thickness less than about 200 microns.

In some embodiments, either or both the top casing and the bottom casing comprises a composite of metallic and dielectric layers.

In some embodiments, the hermetical seal comprises sintered nanoparticles along the perimeter of either or both the top casing and the bottom casing.

In some embodiments, the nanoparticles comprise copper nanoparticles or silver nanoparticles.

In some embodiments, the top encapsulation and/or the bottom encapsulation comprises copper.

In some embodiments, the plurality of spacers comprise a low-thermal conductivity material disposed on either or both the top casing and the bottom casing.

In some embodiments, the plurality of spacers are fabricated by stamping, etching, or molding the plurality of spacers into the top casing and/or the bottom casing.

In some embodiments, the plurality of spacers comprise a polymer structure encapsulated with an encapsulate.

In some embodiments, the encapsulant comprises an inorganic, hermetic layer formed by a deposition process selected from the group consisting of atomic layer deposition, molecular layer deposition, chemical vapor deposition, physical vapor deposition, sol-gel, electroplating, or electroless plating or lamination.

BRIEF DESCRIPTION OF THE FIGURES

These and other features, aspects, and advantages of the present disclosure are better understood when the following Detailed Description is read with reference to the accompanying drawings.

DETAILED DESCRIPTION

Thermal management planes include structures designed with low effective thermal conductivity (e.g., thermal conductivity less than 0.004 W/m-K) and high effective thermal conductivity (e.g., thermal conductivity greater than 1,600 W/m-K). A thermal management plane can be a thermal insulating plane (TIP) or a thermal ground plane (TGP), which may share the same basic structured layers and/or requirements for effective operations. A thermal insulating plane, for example, can be a vacuum-based thermal insulator with extremely low effective thermal conductivities (e.g., thermal conductivity less than 0.004 W/m-K) in the vertical, out-of-plane direction. A thermal ground plane, for example, can be a vapor-based thermal conductor with extremely high effective thermal conductivities (e.g., thermal conductivity greater than 6,000 W/m-K) in the lateral, in-plane direction. The vapor core in a thermal ground plane can be fabricated as a vacuum gap first, followed by filling it with pure water vapor. For many applications, for example, a thermal insulating plane and a thermal ground plane can be integrated into a single device.

Figure 1:
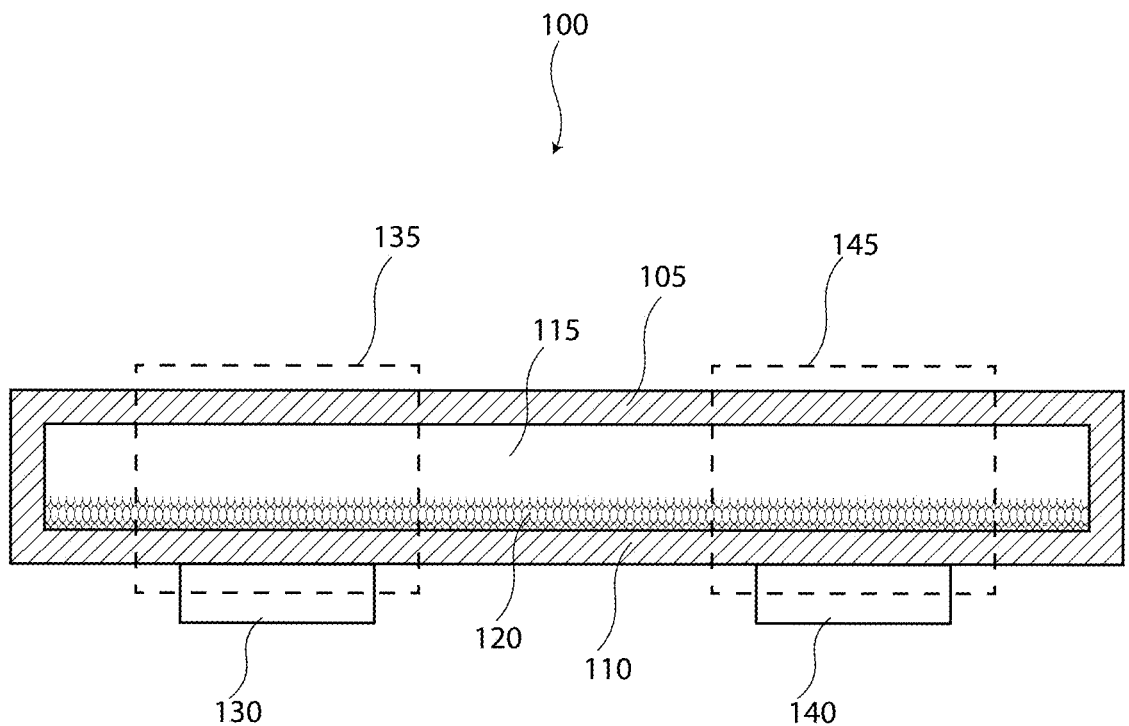
FIG. 1 is a diagram of an example thermal ground plane according to some embodiments.

FIG. 1 is a diagram of an example thermal ground plane 100 according to some embodiments. Thermal ground plane 100 includes a top casing 105 and a bottom casing 110 that are sealed together to enclose a vapor core 115 and/or a wicking structure 120. The top casing 105 and the bottom casing 110 may also enclose a working fluid within the vapor core and/or the wicking layer. The thermal ground plane 100 may be disposed near a heat source 130 and/or a heat sink 140. The area of the thermal ground plane 100 near the heat source 130 may be an evaporator region 135 and/or the area of thermal ground plane 100 near the heat sink 140 may be a condenser region 145. Working fluid, for example, may evaporate from the heat produced by the heat source 130 at or near the evaporator region 135 and/or vapor may condense from the lack of heat from the heat sink 140 at or near the condenser region 145. Vapor may, for example, flow from the evaporator region 135 to the condenser region 145 via the vapor core 115. The working fluid may, for example, flow from the condenser region 145 to the evaporator region 135 via the wicking structure 120.

In some embodiments, the wicking structure 120 may be deposited on either or both the top casing 105 and the bottom casing 110. In some embodiments, the thermal ground plane (e.g., as part of the wicking structure 120) may include a plurality of microstructures. The microstructures may include, for example, a plurality of nanowires deposited on a plurality of micropillars, an array of nanowires, or a plurality of micro-posts with caps, etc.

In some embodiments, the working fluid may include water or any other coolant that may transfer heat from the evaporator region 135 to the condenser region 145, for example, through one or more of the following mechanisms: a) evaporation of the working fluid by absorption of heat dissipated from the heat source 130 to form vapor; b) vapor transport of the working fluid from the evaporator region 135 to the condenser region 145; c) condensation from vapor to liquid with cooling provided by the heat sink 140; and/or d) return of liquid from the condenser region 145 to the evaporator region 135 through capillary pumping pressure resulting from the wicking structure 120.

In some embodiments, a thermal ground plane's thermal performance can be dependent on the configuration yet can be about 3-50 times higher than that of copper.

In some embodiments, the top casing 105 and/or the bottom casing 110 and/or the wicking structure 120 may include copper, stainless steel, silicon, polymer, copper-clad Kapton, and/or flexible material, etc.

Figure 2:
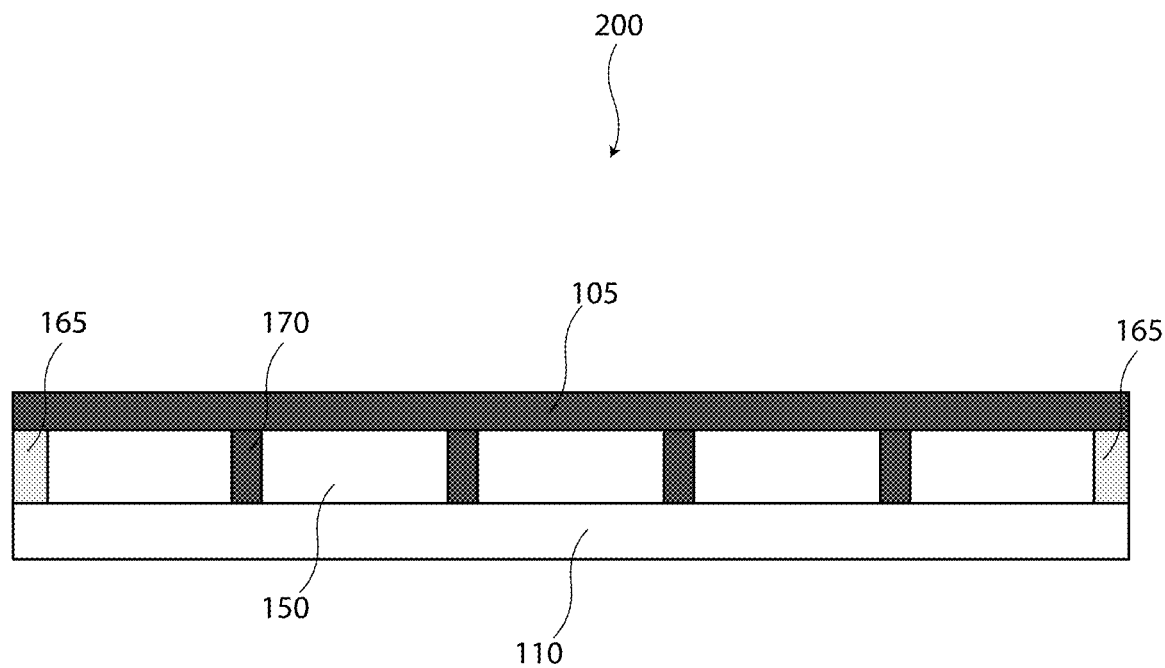
FIG. 2 is an example illustration of a thermal insulating plane according to some embodiments.

FIG. 2 is an example illustration of a thermal insulating plane 200 according to some embodiments. The thermal insulating plane 200, for example, may encapsulate a vacuum space in a vacuum core 150 between two thermal conductors such as, for example, bottom casing 110 (or bottom planar substrate member) and top casing 105 (or top planar substrate member). The bottom casing 110 and the top casing 105 can be hermetically sealed together at seals 165. In some embodiments, the vacuum-enhanced insulator 200 can have extremely low through-plane thermal conductivity (e.g., thermal conductivity less than about 0.004 W/m-K), but medium in-plane thermal conductivity (e.g., thermal conductivity between about 10-1,000 W/m-K), which can smooth out the temperature distribution along the top surface. In some embodiments, the in-plane thermal conductivity may be medium along either or both the top casing 105 and/or the bottom casing 110.

Figure 3:
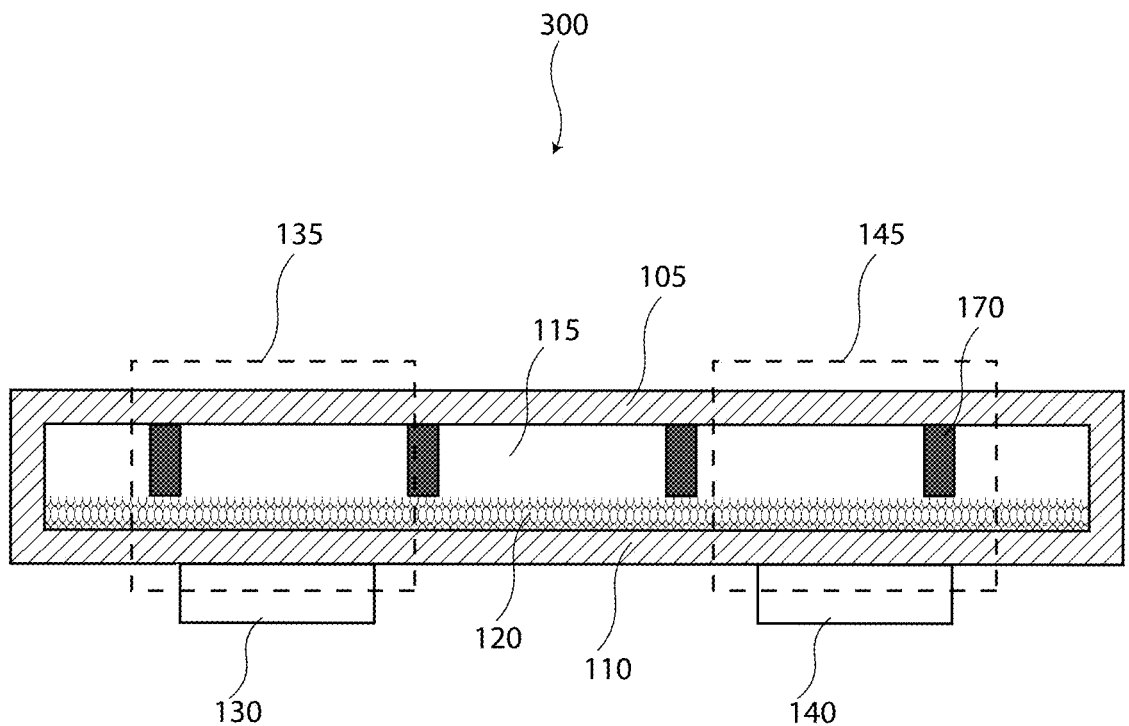
FIG. 3 is an example illustration of a thermal insulating plane according to some embodiments.

There are several thermal resistances associated with a thermal ground plane 300 as shown in FIG. 3. These may include one or more of the following:

$R_{e,\ casing}$—thermal resistance through the bottom casing 110 of the thermal ground plane 300 in the evaporator region 135;

$R_{e,\ mesh}$—thermal resistance through the wicking structure 120, e.g. copper mesh, with water contained in the evaporator region 135;

$R_{a,\ vapor}$—thermal resistance of vapor transport from the evaporator region 135 to the condenser region 145 through the vapor core 115;

$R_{c,\ mesh}$ thermal resistance through the wicking structure 120 with water contained in the condenser region 145;

$R_{e,\ casing}$—thermal resistance through the bottom casing 110 (or the top casing 105) in the condenser region 145;

$R_{a,\ mesh}$—thermal resistance of heat conduction from the condenser region 145 to the evaporator region 135 along the wicking structure 120 with water contained;

$R_{a,\ casing}$—thermal resistance of heat conduction from the condenser region 145 to the evaporator region 135 along the bottom casing 110 (or the top casing 105).

For a thick thermal ground plane (e.g., with a thickness greater than 1 mm) the thickness of the vapor core (e.g., the distance between top casing 105 and the bottom casing 110 or the distance between the top casing 105 and the wicking structure 120) is large (e.g., greater than about 0.35 mm). As a result, vapor can be transported through the vapor core without much flow resistance and the thermal resistance ($R_{a,\ vapor}$) of the vapor transport is negligible. However, for a thin thermal ground plane (e.g., with a thickness less than about 0.35 mm) the gap of the vapor core is small and the thermal resistance ($R_{a,\ vapor}$) of the vapor transport may play a role. In this example, the total thermal performance of a thin thermal ground plane may depend on the performance of the vapor transport.

Figure 4:
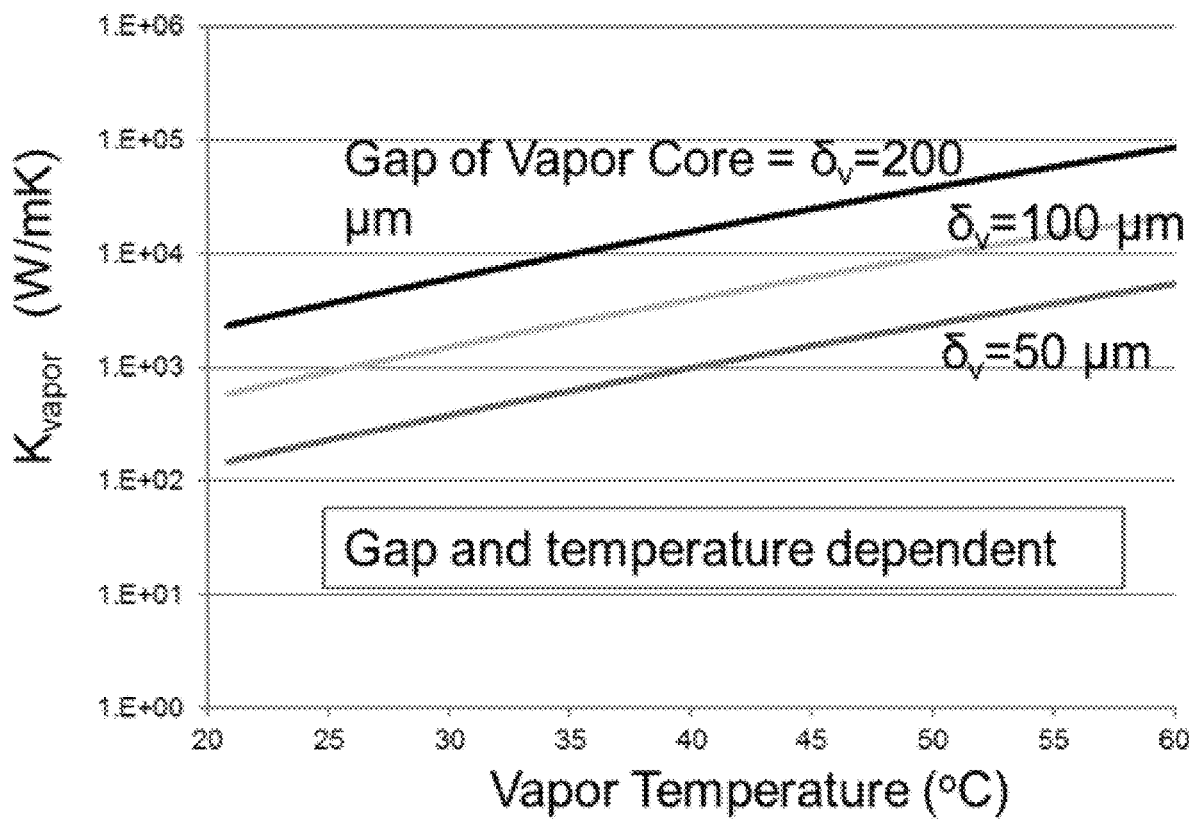
FIG. 4 is a graph illustrating the effective thermal conductivity of the gap of a vapor core.
Figure 5:
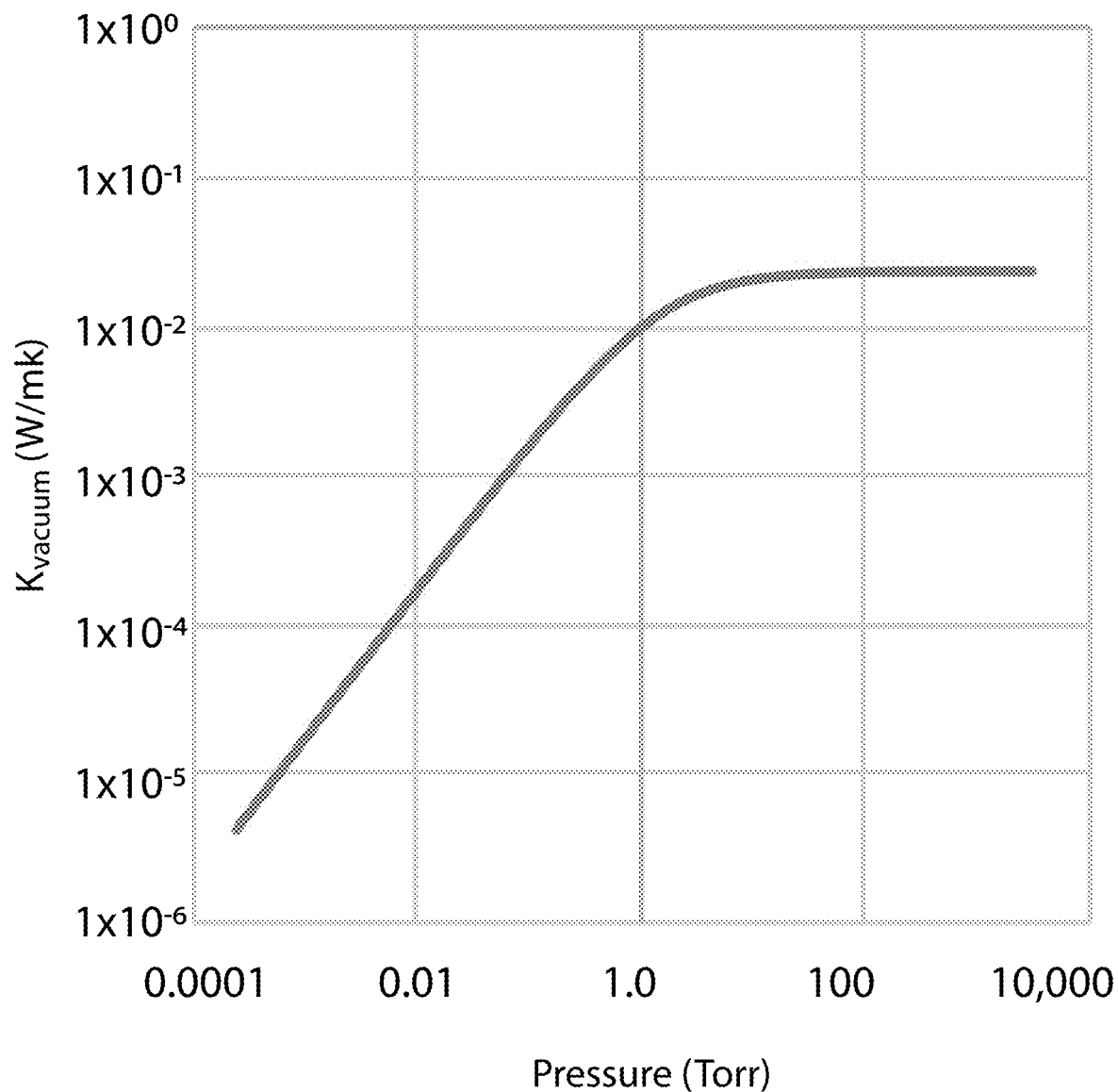
FIG. 5 is a graph illustrating the pressure level effect on thermal conductivity of the vacuum gap.
Figure 6:
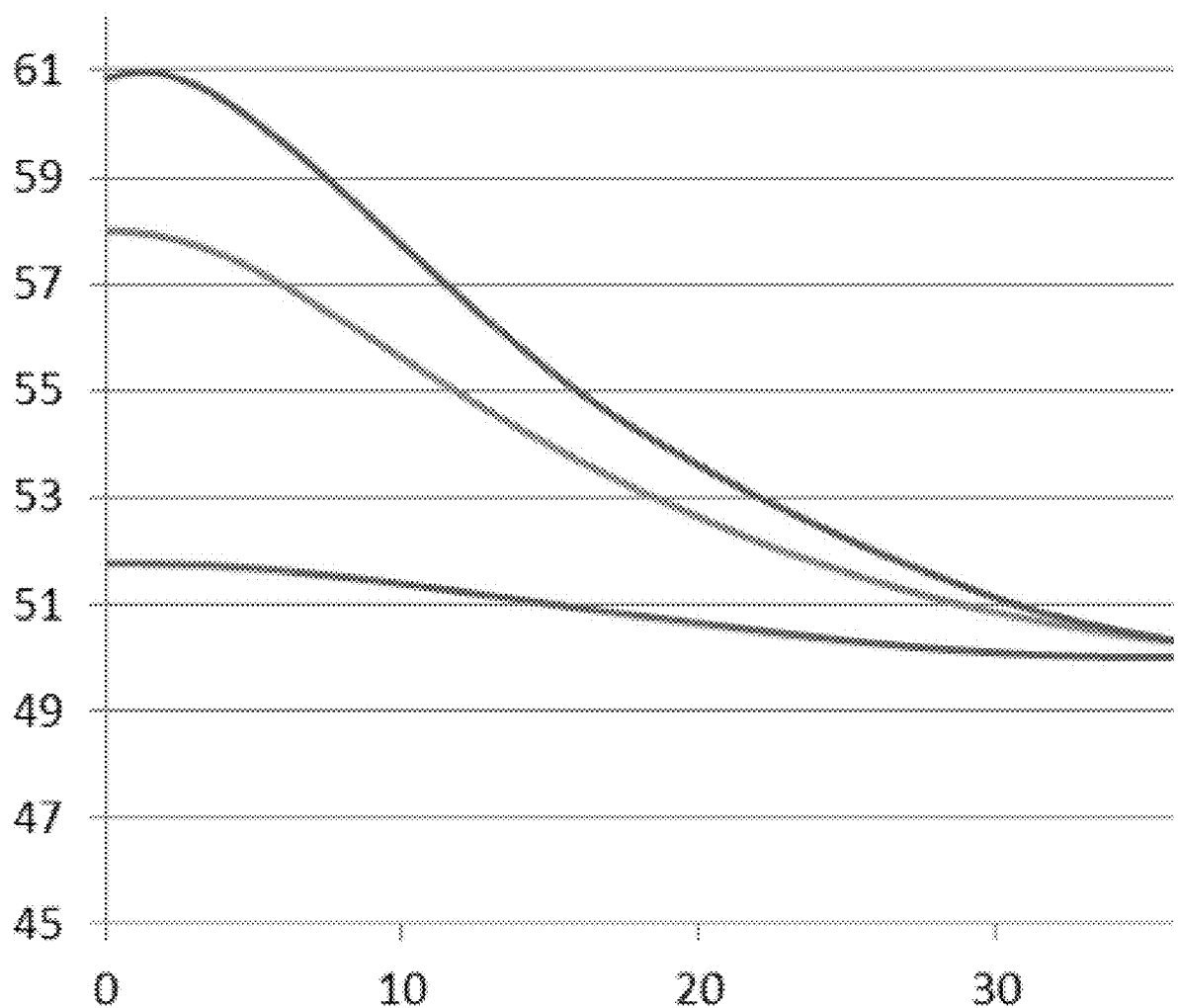
FIG. 6 is a graph illustrating the temperature distribution of the top casing layer of a thermal insulating plane as a function of vacuum level.

In some embodiments, the thermal performance of the vapor transport can also be represented by an effective thermal conductivity of the vapor transport as shown in FIGS. 4, 5, and 6. The effective thermal conductivity can be affected by the gap of the vapor core and the vapor temperatures as shown in FIG. 4. For example, with 45° C. vapor, its effective thermal conductivity could be reduced from 30,000 W/mK to 7,000 W/mK when the gap is decreased from 200 to 100 μm. The thermal conductivity, for example, may be reduced from 7,000 to 2,000 W/mK, for example, when the gap is decreased from about 100 to 50 μm. A gap varying by 50 or 100 μm, for example, could result in significant variations in thermal performance of the vapor transport and the corresponding flexible thermal ground planes.

A thermal insulating plane (e.g., as shown in FIG. 2) may include three layers: the first casing 110 (or bottom casing), the vacuum core 150, and the top casing 105 (or top casing). In the vacuum core 150, there may be some support structures 170 to prevent the casing layers (e.g., the top casing 105 and the bottom casing 110) from collapsing under the vacuum forces (four support structures 170 are shown in this view, any number may be used). The through-plane thermal conductivity can be designed based, for example, on the support structure 170 geometry and/or material. As another example, the through-plane thermal conductivity can be designed based on the degree of vacuum within the cavity.

FIG. 5 shows the pressure level effect on thermal conductivity of the vacuum gap. FIG. 6 shows the temperature distribution of the top casing layer of a thermal insulating plane as a function of vacuum level. In this example, the heater may be placed on the bottom casing. The y-axis is for the surface temperatures in Celsius, and the x-axis is the horizontal distance from the heater in mm.

A thermal management plane can include a thermal ground plane with extremely high effective thermal conductivities (e.g., about 1,600 W/m-K) in the lateral, in-plane directions; a thermal insulating plane with extremely low effective thermal conductivities (e.g., about 0.004 W/m-K) in the vertical, out-of-plane direction; or a combination of both. Several embodiments may enhance the manufacturability and reliability for such products. A thermal ground plane can include the following structures: a top casing 105, wick 120 (e.g., a mesh), vapor core 115, and bottom casing 110. The vapor core 150 may, for example, be hermetically sealed between the top casing 105 and the bottom casing 110. In some embodiments, a thermal insulating plane may require hermetic sealing from their environment.

In some embodiments, the vacuum core of a thermal insulating plane may reduce its thermal resistivity as gasses are out-gassed or leaked into the vacuum core. Similarly, non-condensable gas (NCG) (e.g., oxygen, nitrogen, etc.) that diffuses into the vapor core of a thermal ground plane may be pushed by the vapor until it accumulates in the condenser of the thermal ground plane, and there it would prevent further convection of the vapor, causing inactive and/or dead regions, which may cause heat to travel through the axial casing layer. To avoid these problems, a thermal ground plane, for example, may include a metal casing layer that can help provide a hermetic seal. The hermetic seal may be made, for example, by sealing portions of the top casing and the bottom casing with silver or copper, or metal welding processes such as seam-welding, laser-welding, or thermo-compressive diffusion bonding. In some embodiments, low temperature solders may be used to make the hermetic seal.

In some embodiments, the vapor core 150 of a thermal management plane (e.g., either a thermal ground plane or thermal insulating plane) may be a hollow cavity. In some embodiments, the vapor core 150 may include a vacuum. In some embodiments, the mass of the thermal management plane may be lower than a solid metal. In some embodiments, the thermal management plane may include support structures, casing materials, or wick that are made of polymer. In some embodiments, a ceramic or metallic coating may be applied to any polymer within a thermal management plane, for example, to aide in hermetic sealing.

For a thermal ground plane, for example, further weight reduction can be achieved when the thickness of the wick 120 is reduced. The wick 120, for example, may serve the purpose of providing capillary pumping pressure which may pull liquid to the evaporator region 135; it may also cause fluid drag as liquid flows through the wick 120. In some embodiments, a wick 120 may include micro-pillars, groves etched in to the bottom casing 110 and/or the top casing 105, a mesh, porous opal structures, inverse-opal structures, etc. In some embodiments, a wick 120 with high permeability and high capillary pressure, with a thin form-factor may be used.

Thermal ground plane performance, for example, may be dependent on the volume of the liquid filling it and/or based on what fraction of void space within the wick is filled with liquid. Thermal ground planes, for example, may be filled with a fixed volume of liquid during manufacturing. For a thick wick (e.g., a wick thicker than about 0.15 mm), the percent variation in the wick void space may be small (e.g., less than about 10% of the volume) from one manufactured sample to another, due to the large volume of the wick 120. For a thin wick 120 (e.g., a wick thinner than about 0.10 mm), manufacturing variations can lead to large variations in void volume from one wick 120 to another. In some embodiments, there can be a large difference in the fraction of void space that is filled, if a fixed volume of liquid is used to fill each sample.

Thermal management plane integrating portions of both a thermal ground plane and a thermal insulating plane can be used in some applications such as, for example, smartphones, tablets, etc., extremely high effective thermal conductivities (e.g., greater than about 6,000 W/m-K) in the lateral, in-plane directions while achieving extremely low effective thermal conductivities (e.g., less than about 0.005 W/m-K) in the vertical, out-of-plane direction.

Figure 7:
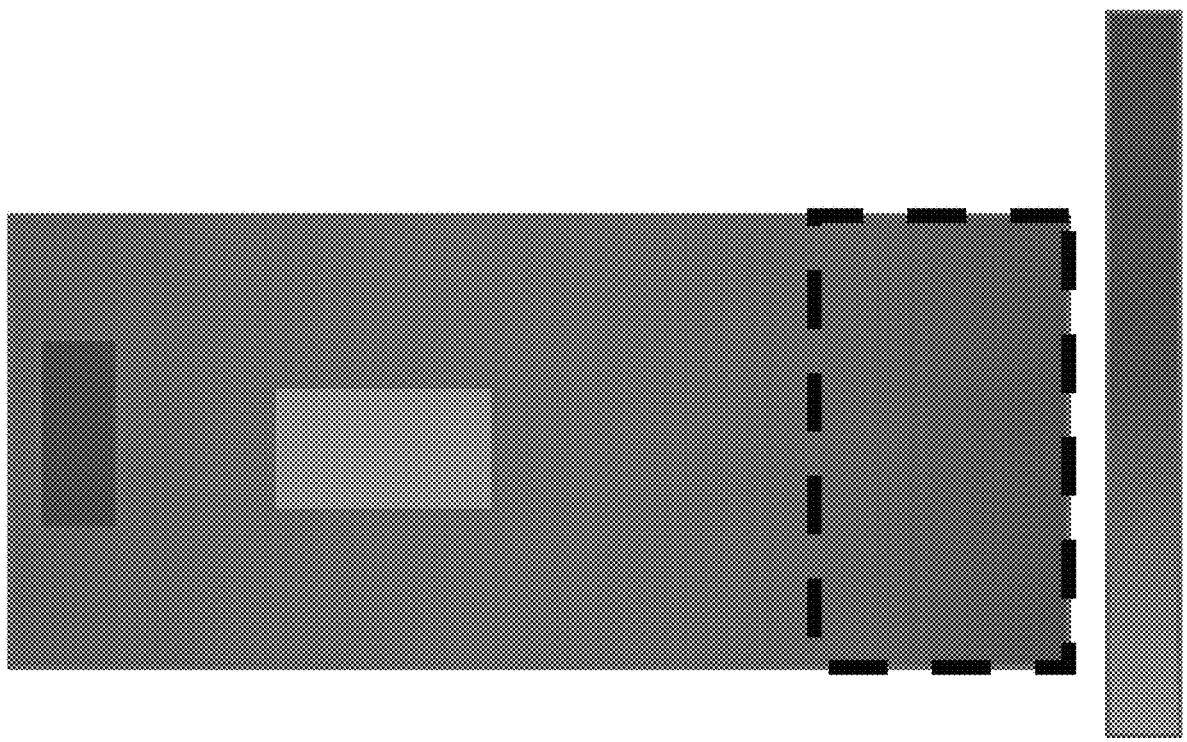
FIG. 7 illustrates temperature gradients in a wearable device with a thermal ground plane and a thermal insulating plane integrated to control warmer and colder regions.

In some embodiments, such thermal management planes used in wearable devices (e.g., virtual reality headsets, head phones, glasses, watches, etc.) where the package may touch the human skin, the temperature should be low for ergonomic comfort, but elsewhere the temperature should be high to dissipate heat by convection. In some embodiments, convection may be most effective if the high temperature were over the maximal amount of area, which necessitates a sharp drop in temperature between the warmer regions and the colder skin-touching regions, as shown in FIG. 7. In this example, the red and pink colored regions illustrate warmer regions, and the blue region illustrates a colder region that touch the human skin. For such a sharp temperature gradient, a thermal insulator may be used in the colder region, so this region may be thermally isolated from the warm regions.

Figure 8A:
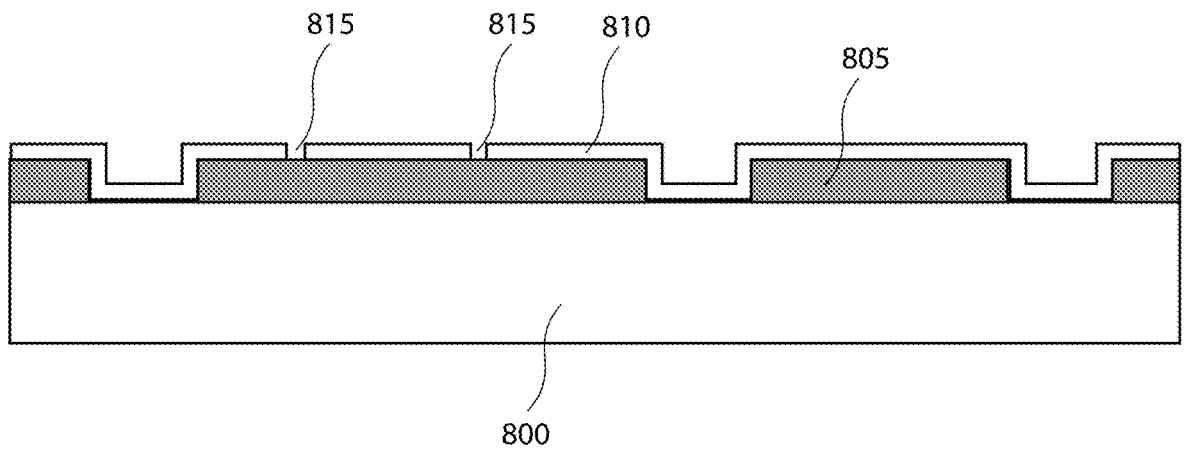
FIG. 8A and FIG. 8B are side views of a thermal management plane casing according to some embodiments.
Figure 8B:
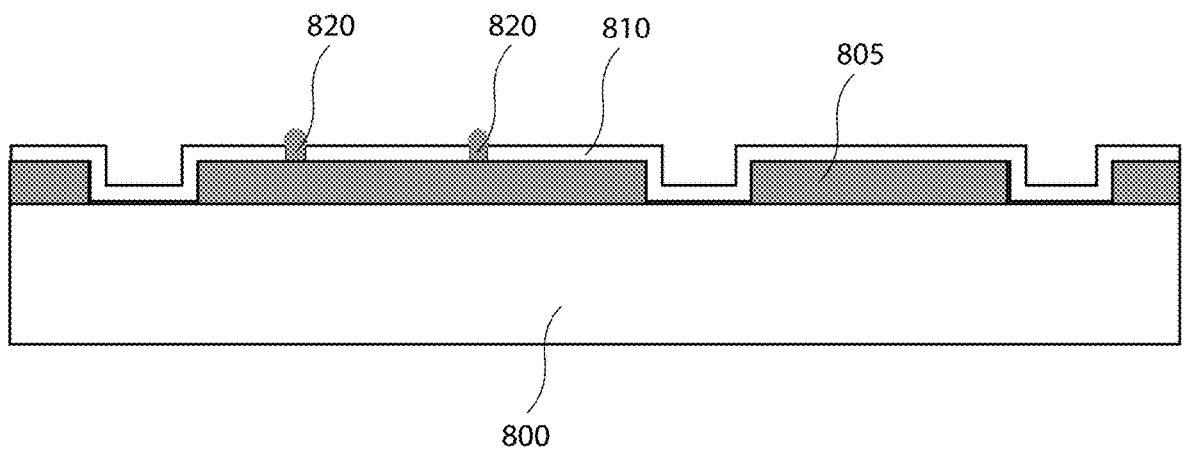

FIG. 8A and FIG. 8B are side views of a thermal management plane casing 800 that includes a self-repairing hermetic seal that can be coated over a polymer layer according to some embodiments.

The casing 800 may comprise a top casing or a bottom casing of a thermal management plane. In some embodiments, the casing 800 may comprise a polymer material. The casing 800 may be coated with a metal coating layer 805 such as, for example, copper layer. The dielectric coating layer 810, for example, may include a 0.1, 1.0, 2.5, or 5.0 μm thick dielectric layer. The dielectric coating layer 810 may be deposited in any number of ways such as, for example, with atomic layer deposition, chemical vapor deposition, physical vapor deposition, sol gel, etc. The dielectric coating layer 810, for example, may include a dielectric-encapsulated copper layer.

The dielectric coating layer 810 may have some manufacturing deficiencies such as, for example, pinholes 815. These pinholes 815 may be formed, for example, in a number of locations throughout the dielectric coating layer 810. In some embodiments, the pinholes 815 may destroy the hermetic seal of the dielectric coating layer 810.

Figure 10:
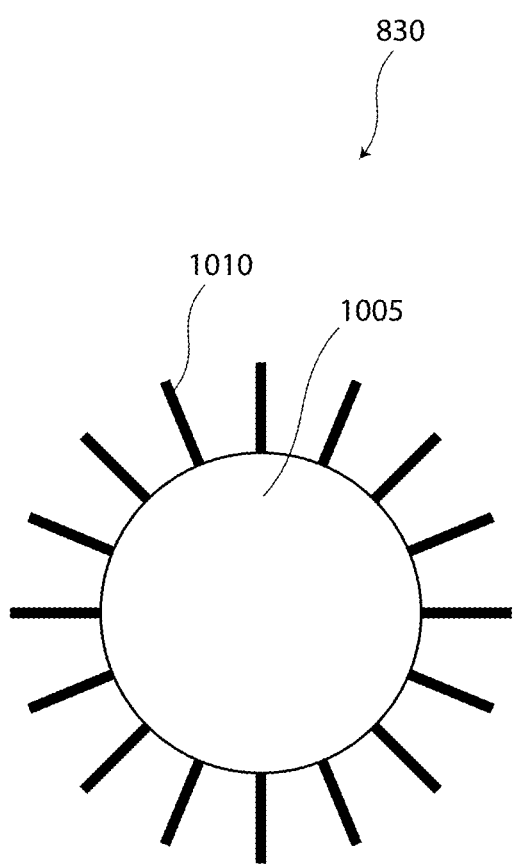
FIG. 10 illustrates a metal nanoparticle with hydrophobic tails according to some embodiments.

In some embodiments, an electroplated metal 820 may be deposited on the metal coating layer 805. In some embodiments, the electroplated metal 820 may include a copper layer. In some embodiments, the electroplated metal 820 may be deposited In some embodiments, the pinholes 815 of the dielectric coating layer 810 can be sealed by depositing a plurality of metal nanoparticles 830 in the pinholes 815. A metal nanoparticle 830, for example, may include a core comprising any type of metal such as, for example, copper or silver. In some embodiments, a metal nanoparticle 830 may include a metallic core 1005 with a plurality of hydrophobic tails 1010 as shown in FIG. 10.

Figure 9A:
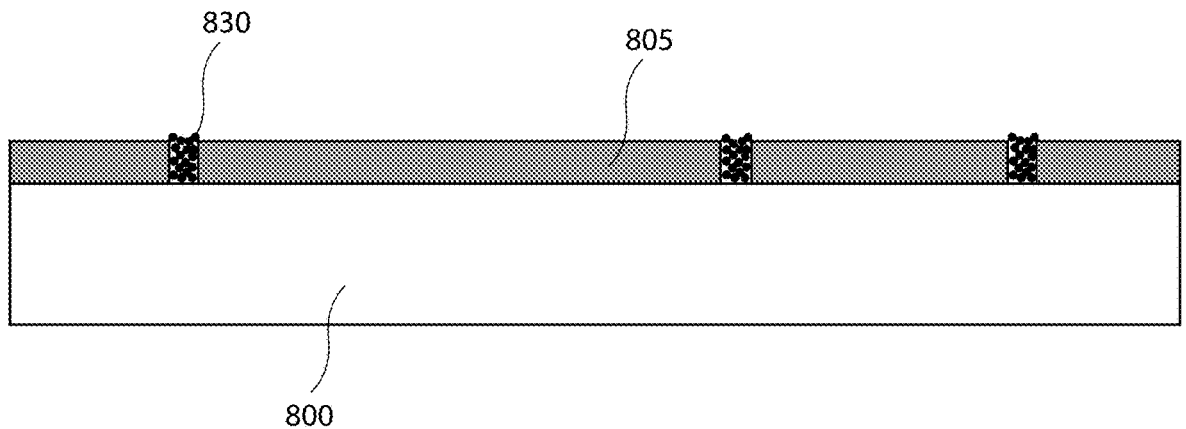
FIG. 9A and FIG. 9B are side views of a thermal management plane casing according to some embodiments.
Figure 9B:
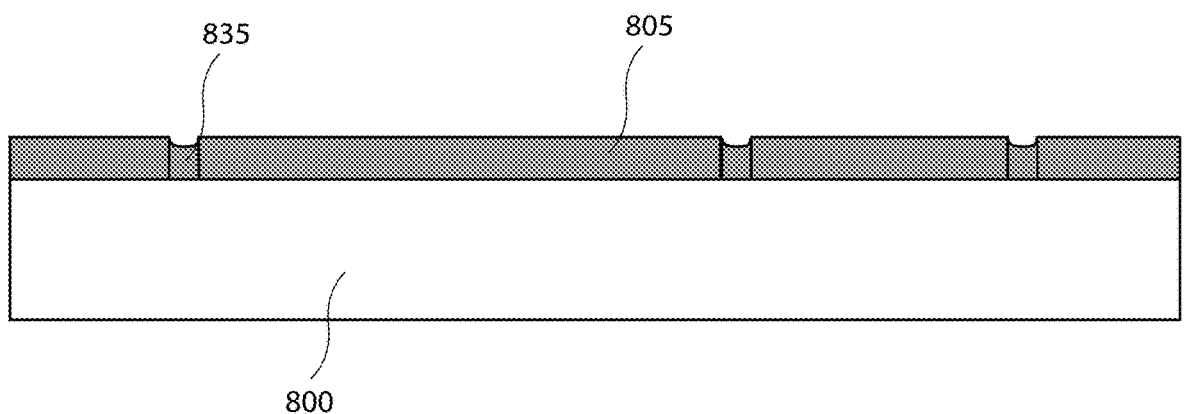

In some embodiments, metal nanoparticles 830 may be used to fill in pinholes 815 as shown in FIG. 9A. In some embodiments, the surface of the casing 800 may be hydrophobic, and the surface of the metal 805 can be hydrophilic. In water, the hydrophobic tails 1010 of a metal nanoparticle 830 may bond to only hydrophobic surfaces such as the casing 800. As a result, these metal nanoparticles 830 may fill the pinholes 815 and bond with casing 800 as shown in FIG. 9A. The nanoparticles 830 can be sintered to fill in the pinholes 815 at temperatures lower than those of bulk materials. As a result, the nanoparticles can be sintered to form a hermetic seal in low temperatures (e.g., temperatures less than about 250° C.). At these lower temperatures, the sintering may not damage the casing 800.

Figure 11A:
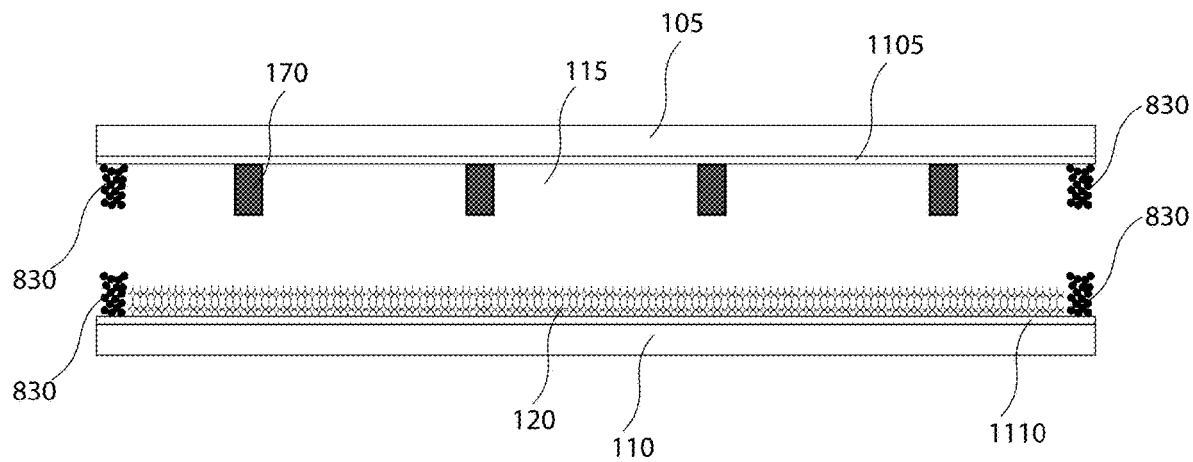
FIGS. 11A, 11B, and 11C illustrate three steps for sealing a thermal management plane according to some embodiments.

In some embodiments, metal nanoparticles 830 may be used as a sealant between the bottom casing 110 and the top casing 105 as shown in FIG. 11A. Metal nanoparticles 830, for example, may have low melting temperature, for example, a copper nanoparticle may have a melting point about 200° C. In some embodiments, copper nanoparticles may have a diameter less than about 100 nm or 10 nm. In some embodiments, copper nanoparticles 830 may include a plurality of copper nanoparticles suspended in a matrix. In some embodiments, the matrix may have a tunable dispensing density and/or tunable rheology. A sealant using copper nanoparticles can be used, for example, to seal together layers at low temperatures. Copper nanoparticles, for example, may have a low meting point such that they will form sintering bonding between about 170° C. to about 300° C. (e.g., about 200° C.). In some embodiments, the bottom casing 110 and/or the top casing 105 may include a thin copper passivation layer 1105 and 1110 (e.g., 0.1, 0.5, 1.0, or 5.0 μm copper film).

Figure 11B:
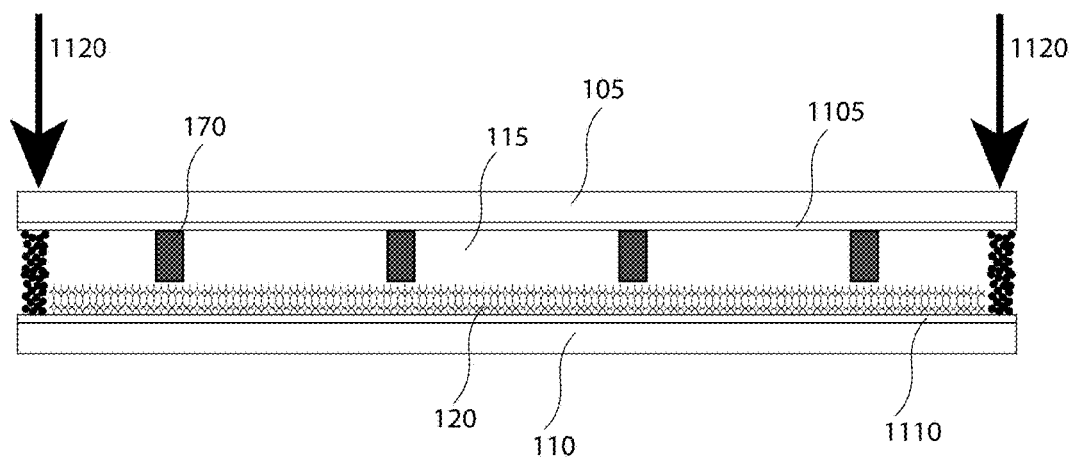
Figure 11C:
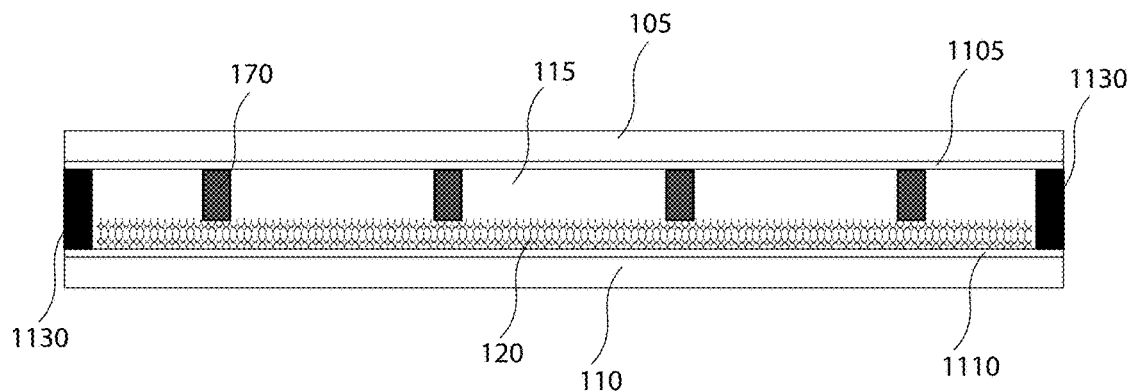

In some embodiments, copper nanoparticles 830 can be disposed around the perimeter of the top casing 105 and/or the bottom casing 110. Pressure 1120 can then be applied around the perimeter of the top casing 105 and/or the bottom casing 110 as shown in FIG. 11B, such as, for example, using various clamps. The perimeter of the top casing 105 and/or the bottom casing 110 may also be heated. For example, the perimeter of the top casing 105 and/or the bottom casing 110 may be heated to a temperature between about 170° C. to 300° C. (e.g., between 250° C. and 300° C. or less than about 250° C.) to form the copper seal. The pressure 1120 and/or the heat can create a hermetic seal between the top casing 105 and the bottom casing 110 using the nanoparticles 830 to create a seal 1130 as shown in FIG. 11C.

Figure 12:
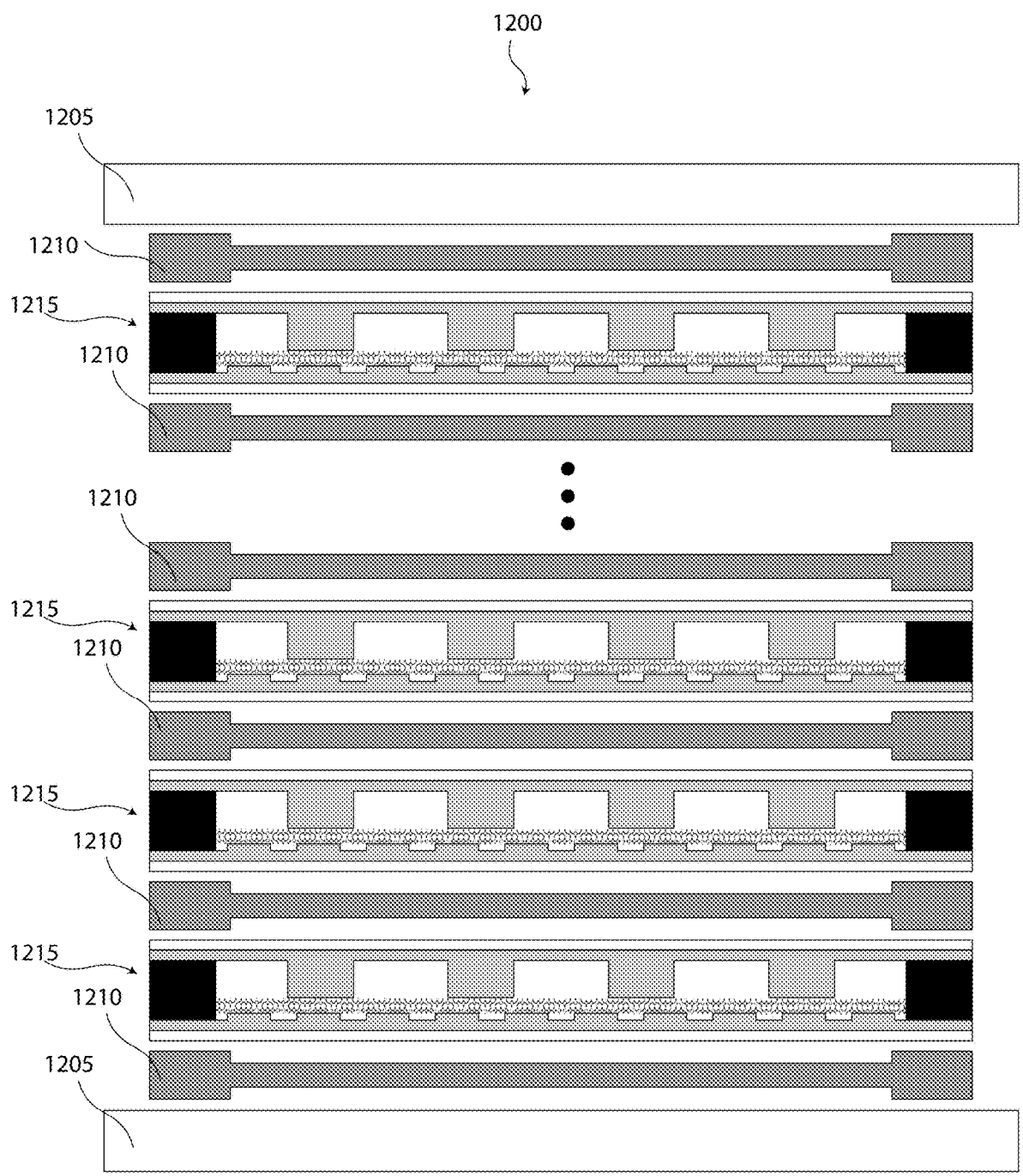
FIG. 12 illustrates a bulk batch assembly process for sealing a plurality of thermal management planes according to some embodiments.
Figure 13:
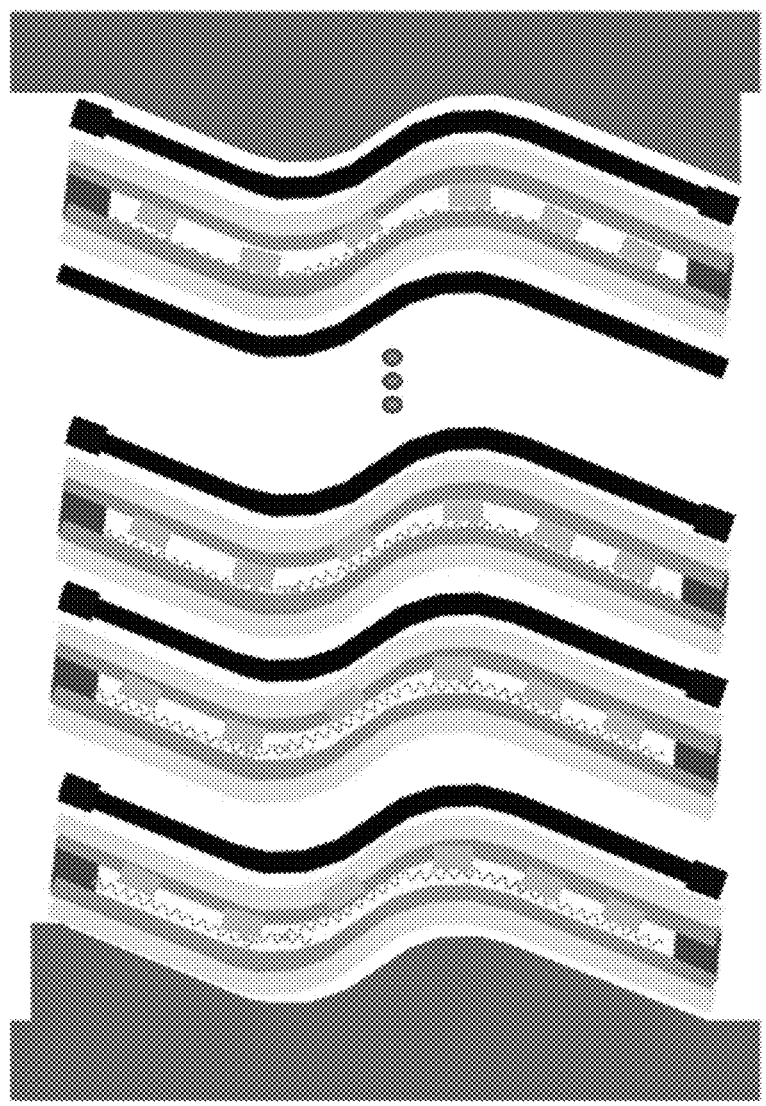
FIG. 13 illustrates a bulk batch assembly process for sealing a plurality of thermal management planes according to some embodiments.
Figure 14:
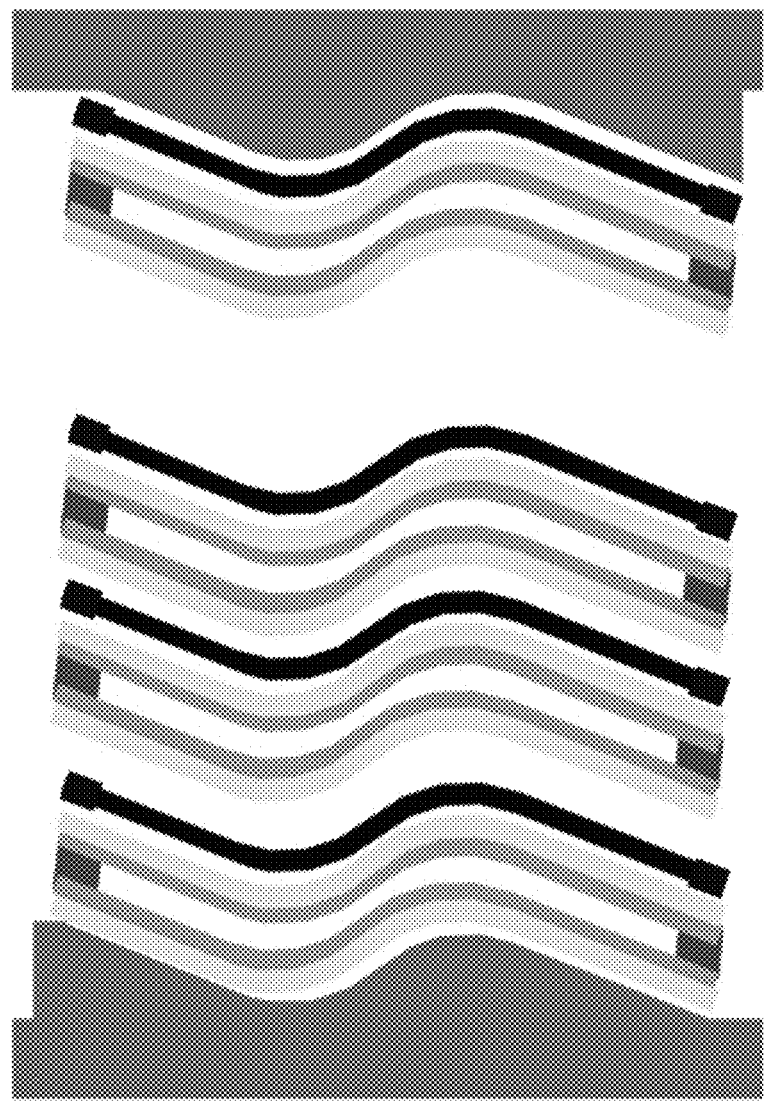
FIG. 14 illustrates a bulk batch assembly process for sealing a plurality of thermal management planes according to some embodiments.

In some embodiments, bulk processes may be used to seal a plurality of thermal management planes at the same time as shown in FIGS. 12, 13, and 14 where tens or hundreds of thermal management planes may be sealed simultaneously. These bulk processes may be used for planar thermal ground planes (FIG. 12), non-planar thermal ground planes (FIG. 13), and thermal insulating planes with a vacuum gap (FIG. 14). In some embodiments, these bulk processes may rely on low temperature sintering, for example, as discussed above in conjunction with FIG. 11.

The top casing 105 and the bottom casing 110 of a thermal management plane can be hermetically sealed together (e.g., the perimeter of the thermal management plane) using copper nanoparticles with sintering temperatures lower than 300° C. in a pressing fixture 1200. In some embodiments, as shown, for example, in FIG. 12, many pre-assemblies of such thermal management planes 1215 can be stacked vertically and pressed between clamping plates 1205 and or press members 1210 in an oven and heated to a temperature to sinter the copper nanoparticles to form a hermetic seal, for example, in a vacuum or a protected environment. While FIG. 12 shows a plurality of thermal management planes 1215 stacked vertically; many such thermal management planes 1215 can be placed on the same pressing fixture 1200 horizontally. The pressing fixture 1200, for example, can be a flat graphite plate. In some embodiments, hundreds of thermal management planes 1215 can be hermetically sealed in temperatures lower than 300° C.

In some embodiments, thermal ground planes, which use metal such as copper, may require the metal to be oxide-free. Copper oxide, for example, will react with water and produce non-condensible gas, which may change the surface character of the microstructure wick, corrode the microstructure wick, and/or prevent effective bonding. Copper oxide may be removed from the casing and/or structural materials using formic acid (HCOOH) in a nitrogen environment at temperatures up to 200° C. At these low temperatures, for example, the polymer in the TGM may not be damaged.

Thermal management planes can include a cavity of liquid and/or vapor for thermal ground planes or a vacuum for thermal insulating planes and casing materials to support these cavities. Various internal support structures may be used to create, support, maintain, and/or define these cavities. FIGS. 15A-15D, 16A-16C, 17A, and 17B are side view examples of thermal management planes that include different types of internal support structures. These internal support structures can be used in thermal ground planes or thermal insulating planes.

Figure 15A:
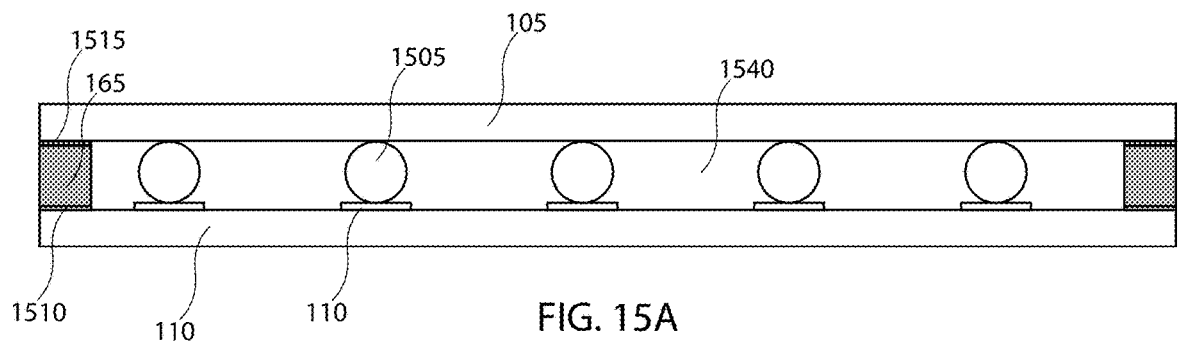
FIG. 15A illustrates a thermal insulating plane with support structures according to some embodiments.

FIG. 15A illustrates a thermal insulating plane with support structures 1505 creating vacuum cavities 2510 between the bottom casing 110 and the top casing 105. The top casing 105 and/or the bottom casing 110 may include internal copper casing layers. The support structures 1505 can include beads, fibers, hollow capillaries aligned out-of-plane, hollow capillaries aligned in-plane, mesh, etc. The support structures 1505 may include ceramic material such as, for example, glass, aluminum oxide, other metal oxides, aerogel, etc. The bottom casing 110 and/or the top casing 105 can be high thermal conductivity metal such as copper, intermediate thermal conductivity metal such as steel, a low thermal conductivity material such as glass, etc. In some embodiments, the support structures 1505 may be bonded to the bottom casing 110 and the top casing 105 via a bonding pad 165. In some embodiments, this bonding may be facilitated by nano-copper powder, gold or copper solder-bonding pads 1510, 1515, ceramic-to-metal or ceramic-to-ceramic diffusion bonding, sol-gel ink, etc. In some embodiments, the support structure 1505 may be held in place by vacuum forces acting on the casing material. The support structure 1505 may include ceramic balls.

Figure 15B:
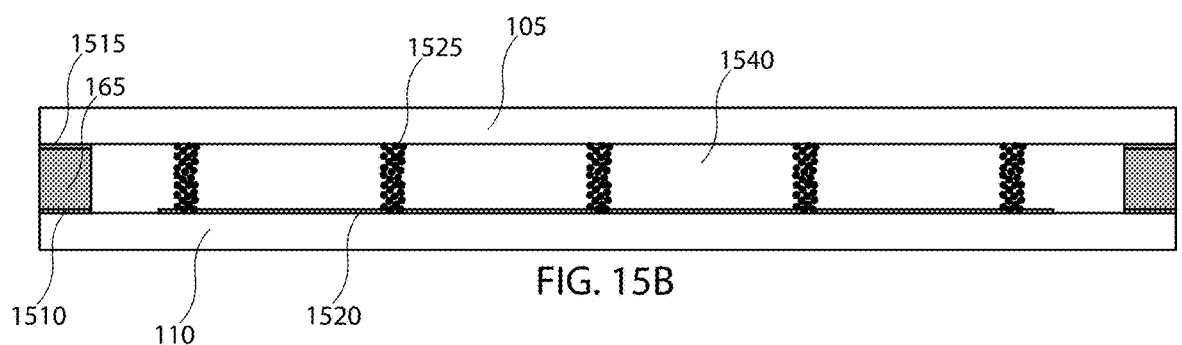
FIG. 15B illustrates a thermal insulating plane with support structure according to some embodiments.

FIG. 15B illustrates a thermal insulating plane with support structures 1525. In some embodiments, the support structures 1525 may comprise a ceramic material. The top casing 105 and/or the bottom casing 110 may include copper casing layers. The formed support structures 1525 may be formed through a template, for example, in which a sol-gel is disposed, or in which a sol-gel acts as a binder for ceramic micro-particles. The formed support structures 1525, for example, may be formed by silk-screen printing techniques. The formed support structures 1525, for example, may be formed by a template-free technique, such as ink-jet printing, 3-D printing, paste application, etc. The formed support structures 1525, for example, may be disposed on either or both of the top casing 105 and/or the bottom casing 110. In some embodiments, the formed support structures 1525 may be disposed on an intermediate layer 1520 placed on one or both of the top casing 105 and/or the bottom casing 110. In some embodiments, the intermediate layer 1520 may be held to the casing layers by the vacuum forces acting on the top casing 105 and/or the bottom casing 110. The support structures 1525, for example, may have a polymer core which is encapsulated by ceramic to prevent out-gassing of the polymer. In some embodiments, encapsulation may occur, for example, using a number of techniques including atomic layer deposition (ALD), molecular layer deposition (MLD), chemical vapor deposition (CVD), physical vapor deposition (PVD), sol-gel, etc. In some embodiments, the polymer core of the support structures 1525 may be disposed using a number of techniques including photo-lithography, etching, silk-screen patterning, 3D printing, etc.

Figure 15C:
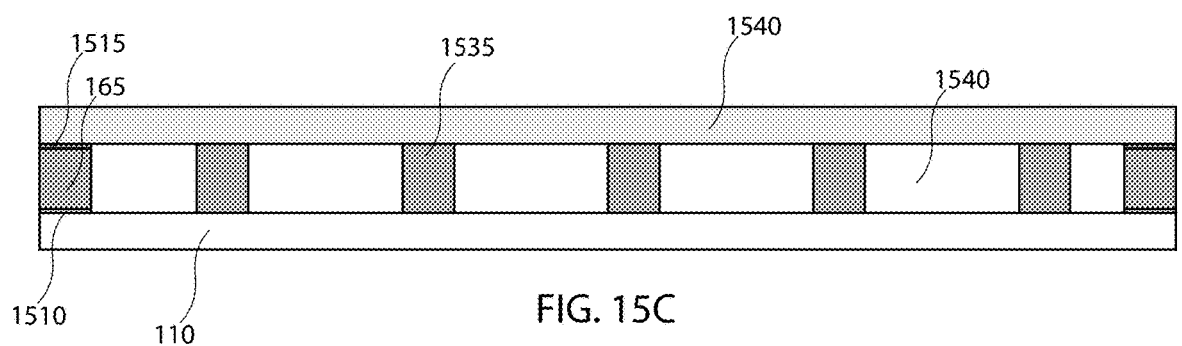
FIG. 15C illustrates a thermal insulating plane with support structures according to some embodiments.

FIG. 15C illustrates a thermal insulating plane with a flexible casing layer 1540. In some embodiments, the flexible casing layer 1540 may be a ceramic. In some embodiments, the flexible casing layer 1540 may be pre-formed with a support structure that defines the vacuum chamber

1540. The bottom casing 110 may include copper layers. The flexible casing layer 1540, for example, may include a flexible glass layer manufactured with a plurality of pillars 1535, or other support geometries including different cross-sections and different through-plane sections. The pre-formed support structures may be formed through any number of manufacturing techniques including etching, molding, 3D printing, etc. The flexible casing layer 1540 may be bonded to a high thermal conductivity layer (e.g., casing 110) such as with copper by a hermetic sealing technique such as metallization and soldering along the perimeter, nanoparticle sintering, anodic bonding, welding, brazing etc. In some embodiments, the flexible casing layer 1540, for example, may be bonded to a low thermal conductivity bottom casing 110, through any number of hermetic bonding methods.

Figure 15D:
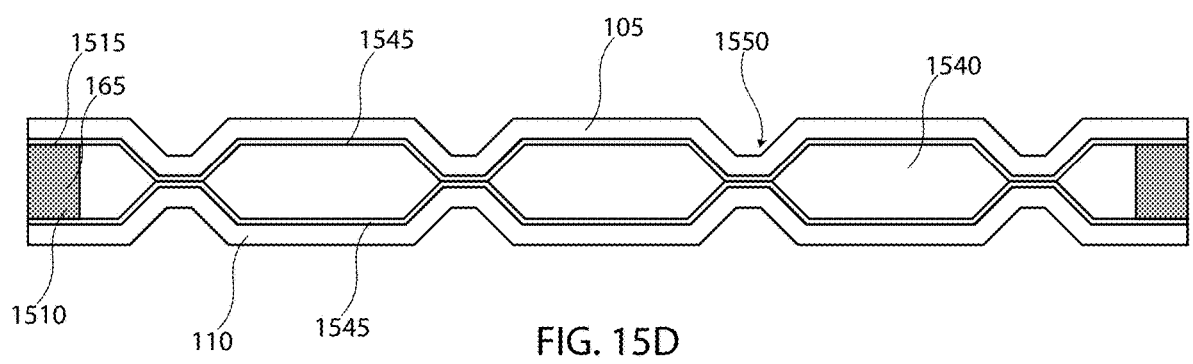
FIG. 15D illustrates a thermal insulating plane with support structures according to some embodiments.

FIG. 15D illustrates a thermal insulating plane with a hermetically encapsulated polymer casing layers pre-formed with support structures 1550. In some embodiments, the top casing 105 and/or the bottom casing 110 may include polymer layers coupled with copper layers 1545 (e.g., a thin layer of copper). The support structures 1550 may be formed by deforming the polymer/copper through a punching process, on one or both the top casing 105 and/or the bottom casing 110. In some embodiments, the support structure may include a polymer layer formed with support structures such as pillars through processes such as molding, lithography, crimping, etching, etc.; and/or encapsulated with metal, ceramic, or hybrid hermetic encapsulation layers deposited through ALD, MLD, CVD, PVD, sol-gel, electroplating, electro-less plating, lamination, etc. In some embodiments, the top casing 105 and/or the bottom casing 110 may include an encapsulated, formed polymer; or one layer may be of the encapsulated formed polymer which is then bonded to a second casing layer with high, intermediate, or low thermal conductivity. The bonding between the top casing 105 and/or the bottom casing 110, for example, may take the form of low-temperature or medium temperature (<400° C.) bonding processes, including metallization and soldering, nanoparticle sintering, epoxy followed by hermetic encapsulation, etc.

Figure 16A:
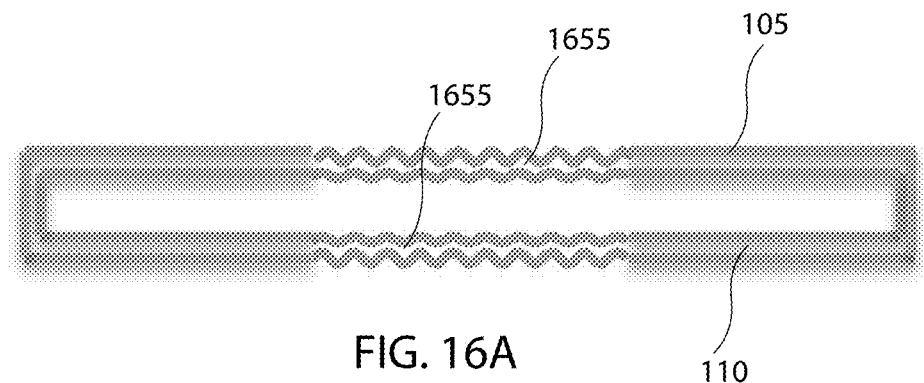
FIG. 16A illustrates a thermal insulating plane with a top casing and/or bottom casing having a wavy structure according to some embodiments.

FIG. 16A illustrates a thermal insulating plane with a top casing 105 and/or bottom casing 110 having a wavy structure 1655 that may, for example, increase flexibility of the thermal management plane. In some embodiments, the wavy structure 1655 may include a micro-textured out-of-plane wavy structure with amplitude in the vertical direction that may, for example, reduce the surface stress and/or strain of brittle encapsulating materials. An out-of-plane wavy structure, for example, may have an amplitude that extends out of the plane of the surface (e.g., vertically) of the top casing 105 and/or the bottom casing 110. In some embodiments, texturing could be confined to one or both surfaces of one or both casing layers.

Figure 16B:
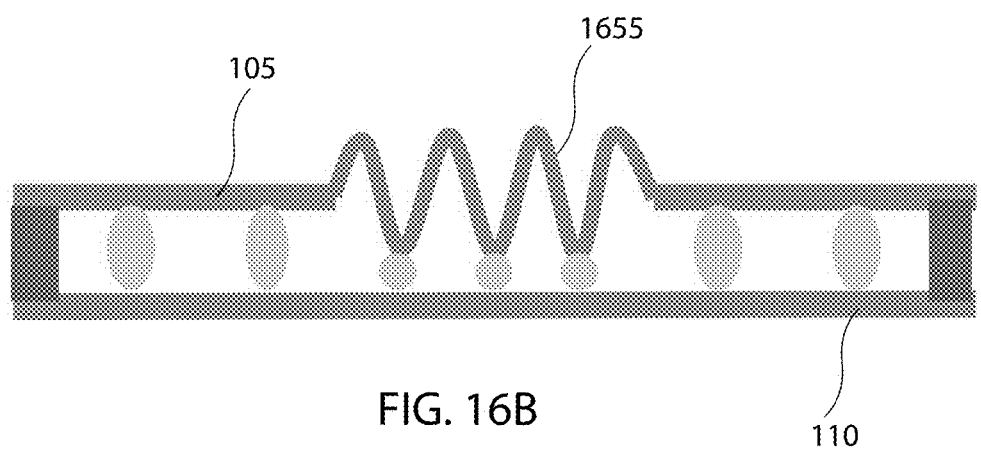
FIG. 16B illustrates a thermal insulating plane with a top casing and/or bottom casing having a wavy structure according to some embodiments.
Figure 16C:
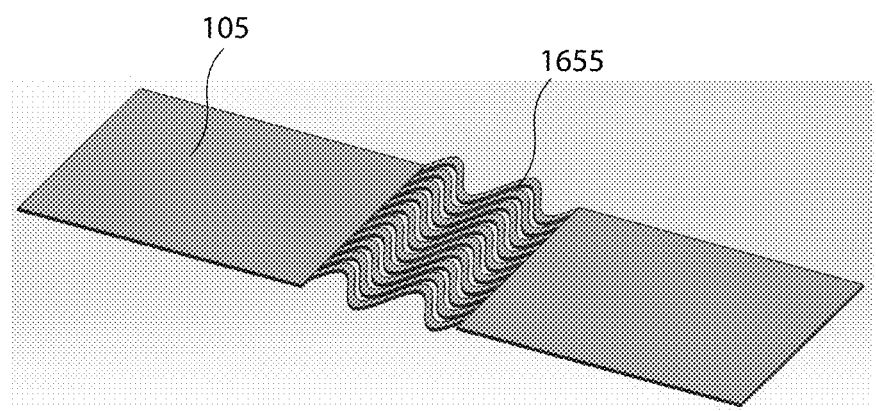
FIG. 16C illustrates a thermal insulating plane with a top casing and/or bottom casing having a wavy structure according to some embodiments.

In some embodiments, the wavy structure 1655 may include miniature-scale out-of-plane wavy structures (e.g., wavy structures with wavelengths larger than the thickness of casing material) to reduce the strain of the entire encapsulating structure on one or both of the encapsulating layers as shown in FIG. 16B. In some embodiments, the wavy structure may encompass a portion of or the entire thickness of the casing layers (e.g., top casing 105 and/or bottom casing 110). In some embodiments, the wavy structure 1655 may also include the use of in-plane wavy structures (e.g., wavy structures with amplitude planar with the surface, e.g., having a flat profile in the vertical direction) as shown in FIG. 16C. In some embodiments, the wavy structure 1655 may include the thickness of both casing layers and the vacuum layer. In some embodiments, the sides of each occurrence of the wavy structure must be hermetically sealed.

Figure 17A:
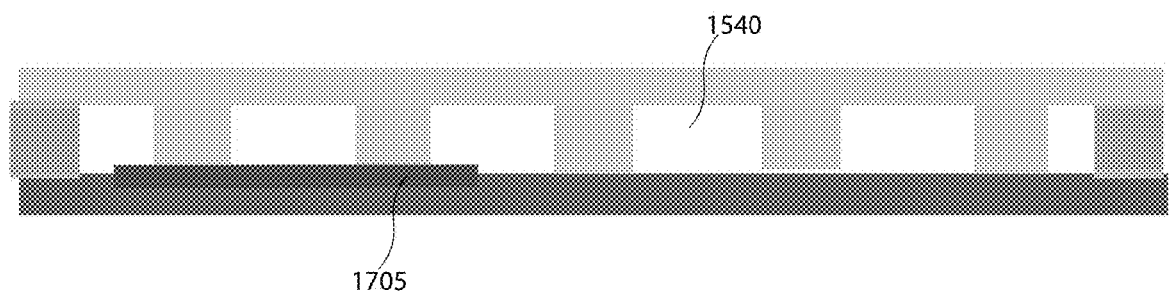
FIG. 17A illustrates a thermal management plane with a getter material within portions of the cavity of a thermal management plane according to some embodiments.

FIG. 17A illustrates a thermal management plane with a getter material 1705 within portions of the vacuum chamber 1540 of a thermal management plane. The getter material 1705, for example, may aid in formation of the vacuum. In some embodiments, the getter material 1705 may include reactive material placed inside the vacuum chamber 1540, for example, for the purpose of improving the efficiency of that vacuum by scavenging unwanted contaminates. The getter material 1705, for example, may maintain the vacuum in the occurrence of any ingress of gaseous molecules into the vacuum space.

Figure 17B:
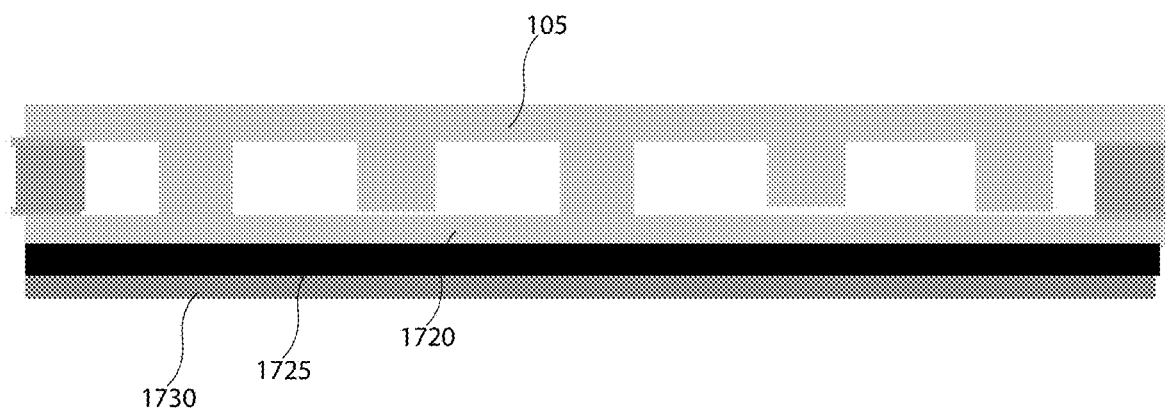
FIG. 17B illustrates a thermal management plane with medium or low thermal conductivity material for the top casing and the bottom casing according to some embodiments.

FIG. 17B illustrates a thermal management plane with medium or low thermal conductivity material for the top casing 105 and the bottom casing 110. In some embodiments, the top casing 105 can comprise glass. In some embodiments, the bottom casing can include, a glass layer 1720, an epoxy layer 1725, and a copper layer 1730.

In some embodiments, a thermal management plane may include multiple vacuum cavities within the vacuum layer. Multiple vacuum cavities, for example, may prevent loss of vacuum in the entire vacuum layer in the event of a localized vacuum leak.

Some embodiments may include a thermal management plane that includes both a thermal ground plane and a thermal insulating plane. In some applications, (e.g. wearable electronics) regions of the thermal management plane can have lower temperature specifications, for example, for ergonomic purposes. In some embodiments, a thermal management plane may include a thermal insulating region with the thermal ground plane. In some embodiments, a portion of the wick in a region of the thermal ground plane may be removed and the region may be isolated, for example, with a vacuum.

Figure 18A:
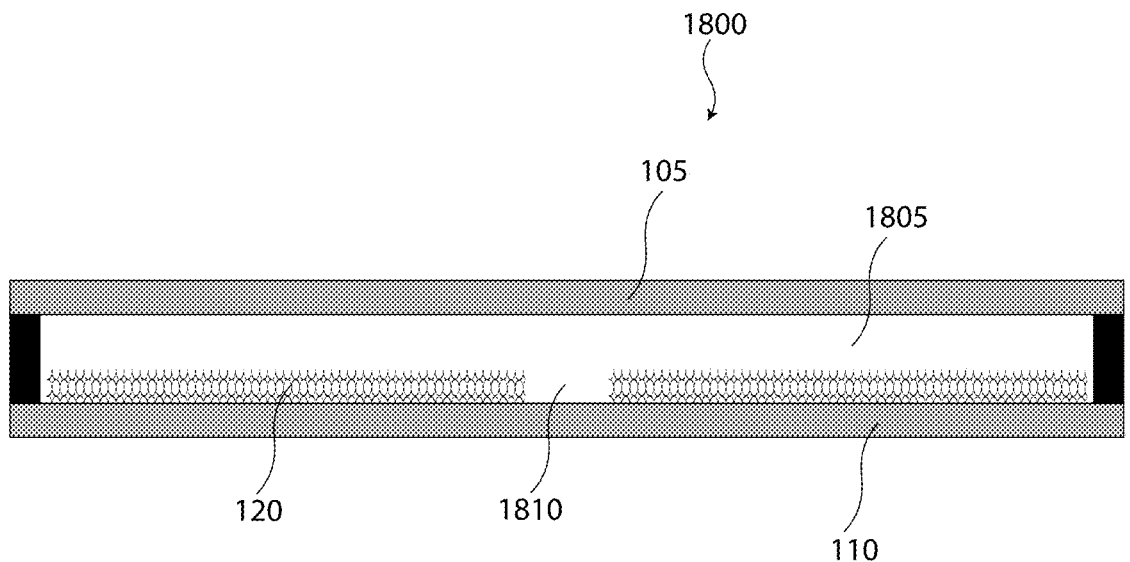
FIG. 18A shows a side view of a thermal management plane with a vacuum cavity, and a wick having a non-wick region according to some embodiments.
Figure 18B:
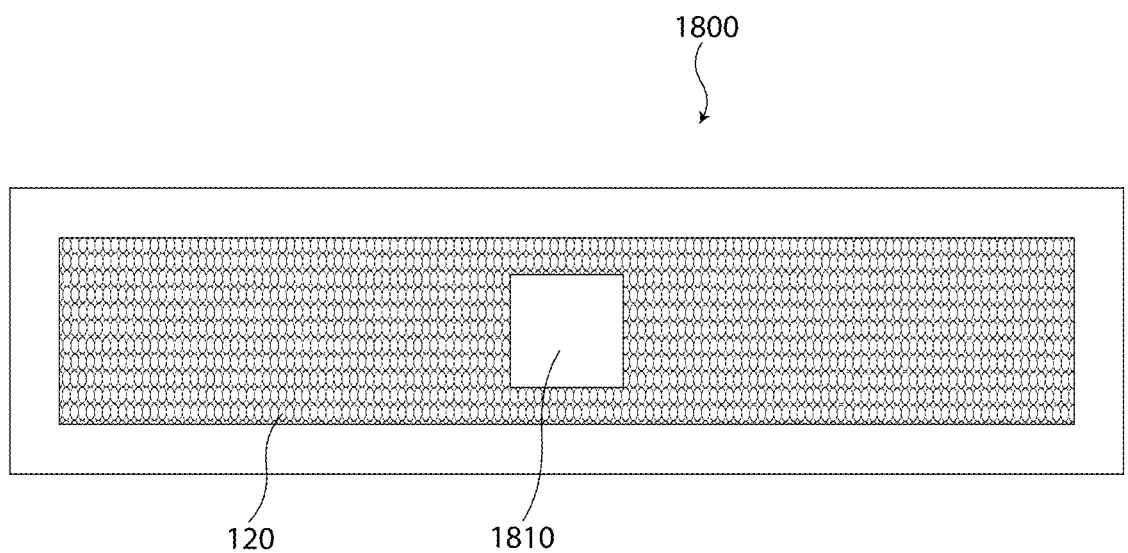
FIG. 18B shows a top view of the thermal management plane with a wick having a non-wick region according to some embodiments.

The fabrication of a thermal management plane including a thermal insulating region with the thermal ground plane is illustrated in FIGS. 18A, 18B, 19A and 19B. FIG. 18A shows a side view of a thermal management plane 1800 with a vacuum cavity 1810, and a wick 120 having a non-wick region 1810. FIG. 18B shows a top view of the thermal management plane 1800 with a wick 120 having a non-wick region 1810. In this example, the vacuum cavity 1810 extends into the non-wick region 1805.

Figure 19A:
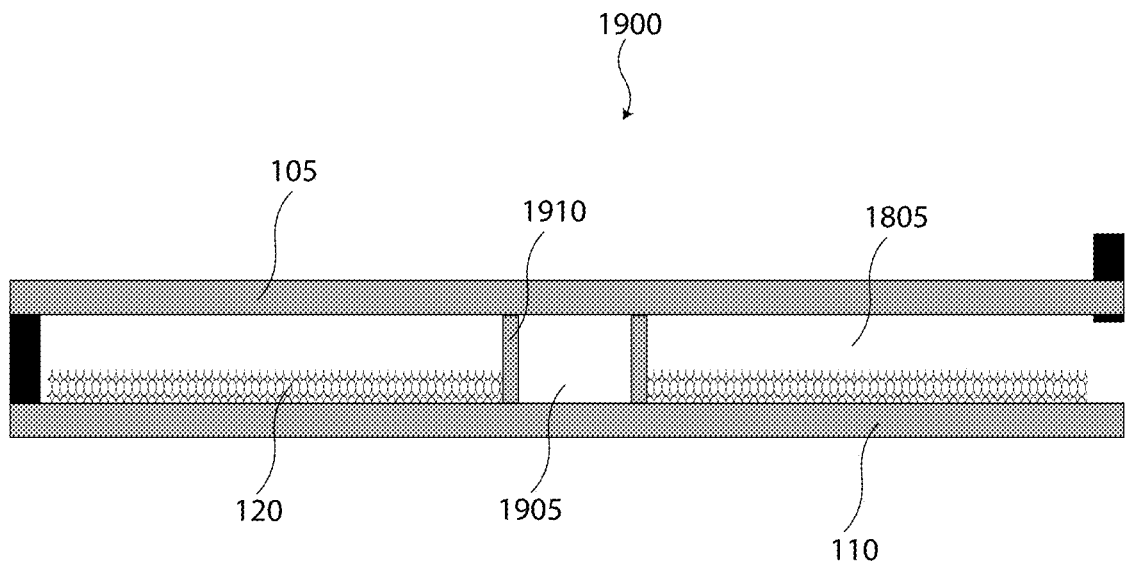
FIG. 19A shows a side view of the thermal management plane with an isolated vacuum cavity according to some embodiments.
Figure 19B:
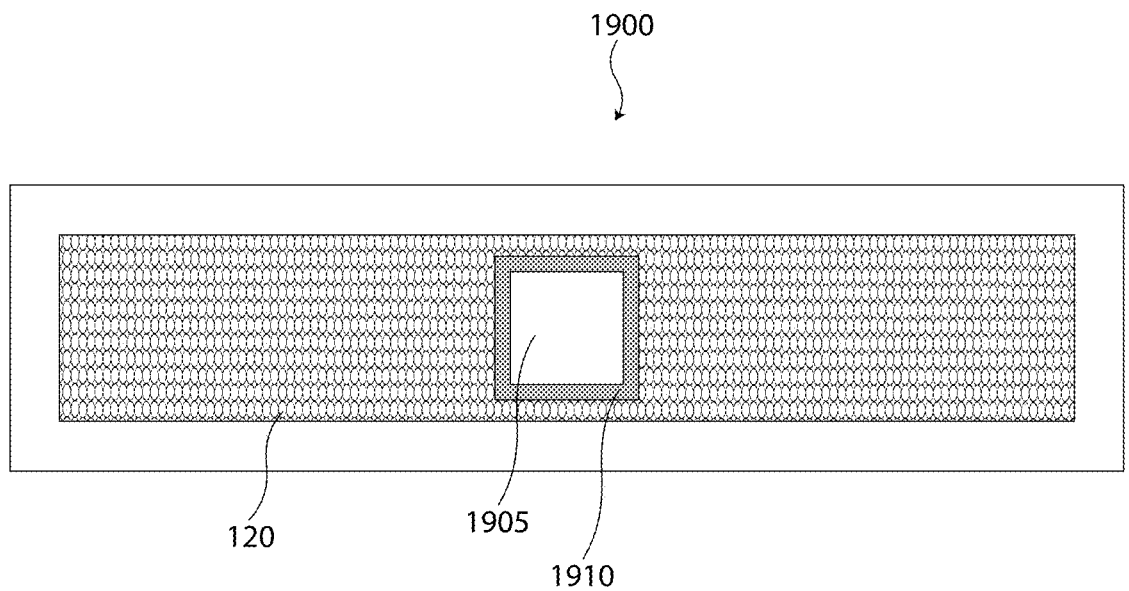
FIG. 19B shows a top view of the thermal management plane with an isolated vacuum cavity according to some embodiments.

In some embodiments, the non-wick region 1810 may be isolated from other portions of the thermal management plane and/or creating a vacuum in the non-wick region 1810. FIG. 19A shows a side view of the thermal management plane 1900 with an isolated vacuum cavity 1905. FIG. 19B shows a top view of the thermal management plane 1900 with an isolated vacuum cavity 1905. In some embodiments, the isolated vacuum cavity 1905 may be isolated by bonding 1910 (e.g., diffusion bonding) portions of the top casing with portions of the bottom casing 110. In some embodiments, any type of hermetic sealing method may be used to bond portions of the top casing 105 with portions of the bottom casing 110. In some embodiments, when the thermal management plane 1900 is filled with liquid, the isolated vacuum cavity 1905 remains under vacuum. In some embodiments, various structures may be in place to support the casing from collapsing into the isolated vacuum cavity 1905 as described in this document. For example, such support structures can be similar to any support geometry used in a thermal management plane, or it can be optimized for thermal isolation of the skin-touching side of the thermal management plane.

Ultrathin ceramic films (e.g., less than about 100 nm) can increase the wettability of a liquid wick of a thermal ground plane, increase hermeticity of the thermal ground plane or thermal insulating plane casing, as well as preventing outgassing of polymers into a vapor or vacuum core through cracks in a metal coating.

In some embodiments, an ultrathin (e.g., less than about 100 nm) ceramic film can be coated and/or deposited onto an internal structure of a thermal management plane. In some embodiments, the ultrathin ceramic film can be deposited using atomic layer deposition (ALD) and/or molecular layer deposition (MLD). An ALD, for example, can be a sequential, self-limiting vapor phase deposition method for atomic layer growth. MLD, for example, may be a similar process for organic molecule growth.

Figure 20A:
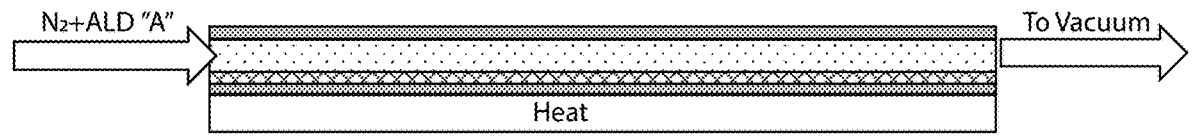
FIGS. 20A, 20B, 20C, and 20D illustrate steps for coating or depositing a film within a thermal management plan according to some embodiments.

In some embodiments, an inlet and/or outlet port may be attached to the thermal management plane as shown in FIG. 20A. A reactant chemical "A" (e.g. trimethylaluminum) can be carried in a nitrogen vapor stream through the cavity of the thermal management plane, where it reacts with the internal surfaces. Unreacted "A" and the carrier nitrogen may be pulled out the outlet port. This flow may continue for a predetermined period of time or until the surface is fully coated with "A". A heating element may be coupled with the thermal management plane during the deposition process.

Figure 20B:
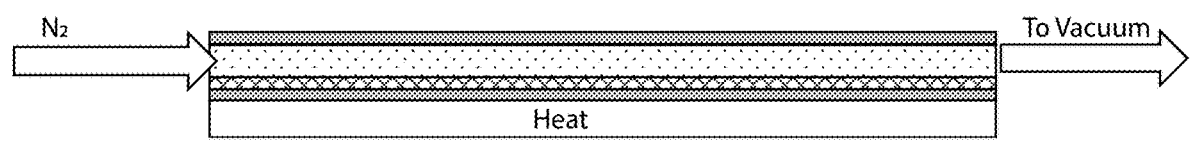

In some embodiments, a pure nitrogen flow can enter through the input port and may purge unreacted A from the volume as shown in FIG. 20B.

Figure 20C:
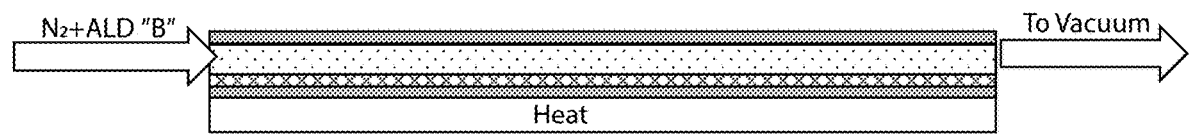

In some embodiments, reactant chemical "B" (e.g. water) can be carried by a nitrogen vapor stream through the cavity of the thermal management plane as shown in FIG. 20C. The reactant chemical B can react with the surface coating to form a monolayer of the desired film (e.g. $Al_2O_3$) over the internal surfaces.

Figure 20D:
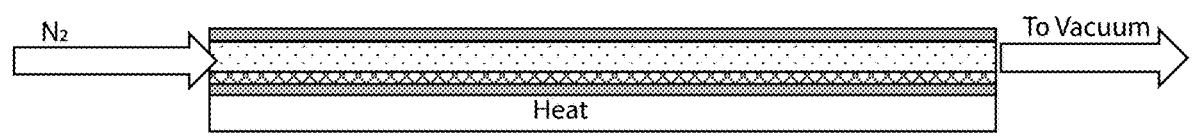

In some embodiments, a pure nitrogen flow can enter through the input port and may purge unreacted A from the volume as shown in FIG. 20D.

In some embodiments, the process may be repeated an arbitrary number of times until a film of the desired thickness is grown on the internal surfaces of the thermal management plane. Other carrier gasses instead of nitrogen can be used.

Figure 21:
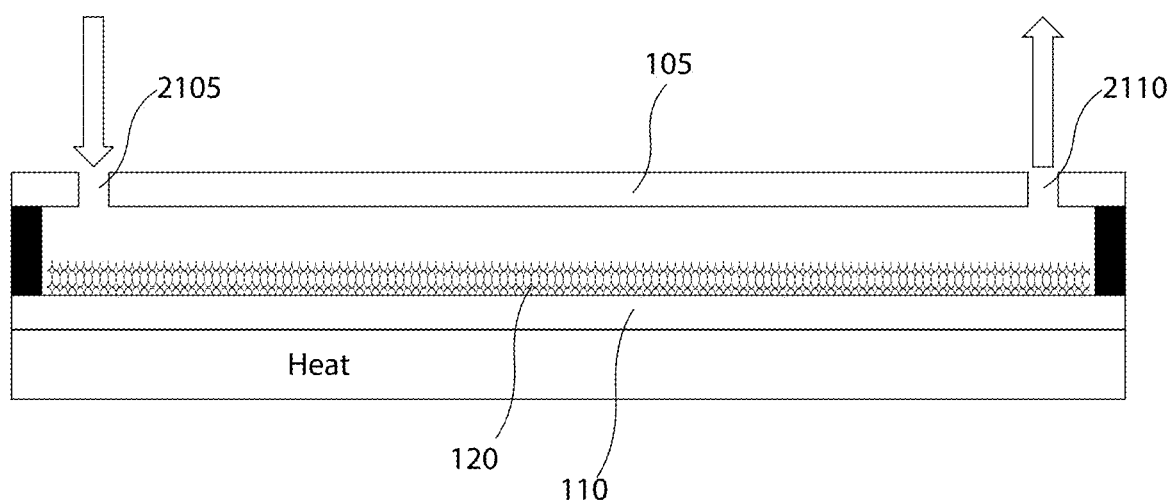
FIG. 21 illustrates coating or depositing a film within a thermal management plane according to some embodiments.

In some embodiments, an inlet port 2105 and/or an outlet port 2110 can be out-of-plane with the thermal management plane as shown in FIG. 21.

Figure 22:
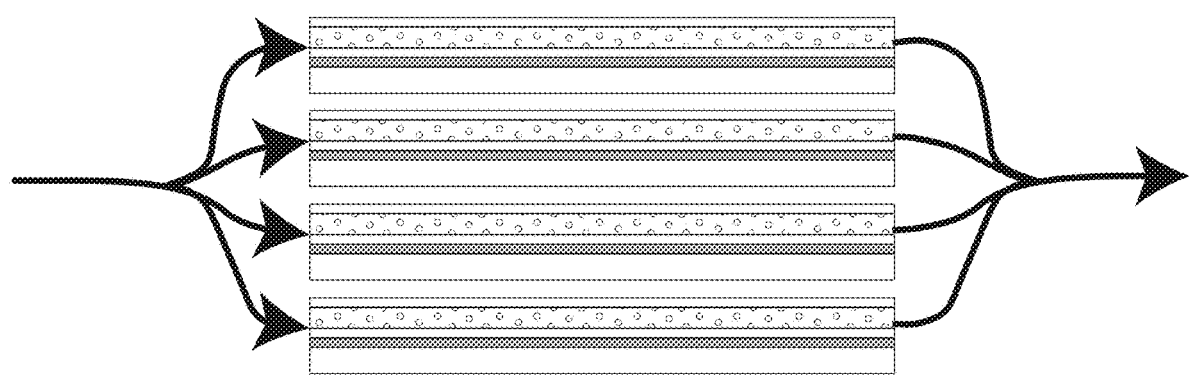
FIG. 22 illustrates coating or depositing a film within a plurality of thermal management planes according to some embodiments.

In some embodiments, an internal ceramic film can be deposited within a plurality of thermal management planes using a batch process as shown in FIG. 22.

Figure 23:
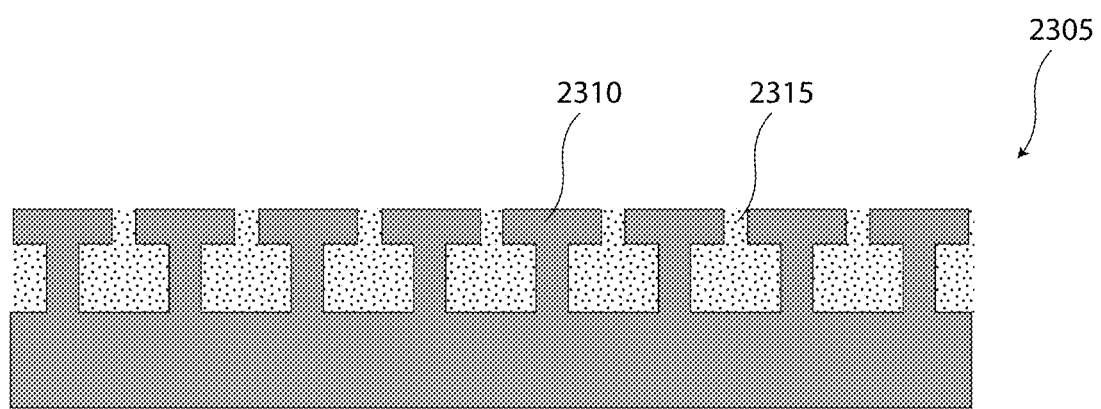
FIG. 23 illustrates a wick with an array of micropillars and caps according to some embodiments.

In some embodiments, ultrathin thermal management planes may include thin wicks (e.g., having a thickness less than about 0.1 mm), which, for example, can have high capillary pressure and/or high permeability. In some embodiments, the wick may include an array of micropillars with caps, as shown in FIG. 23. The wide gap between the pillars (e.g., a gap less than about 0.075 mm), for example, may allow for high permeability. The narrow gap between the caps (e.g., a gap less than about 0.025 mm), for example, may provide the small capillary radius and a high capillary pressure.

Figure 24:
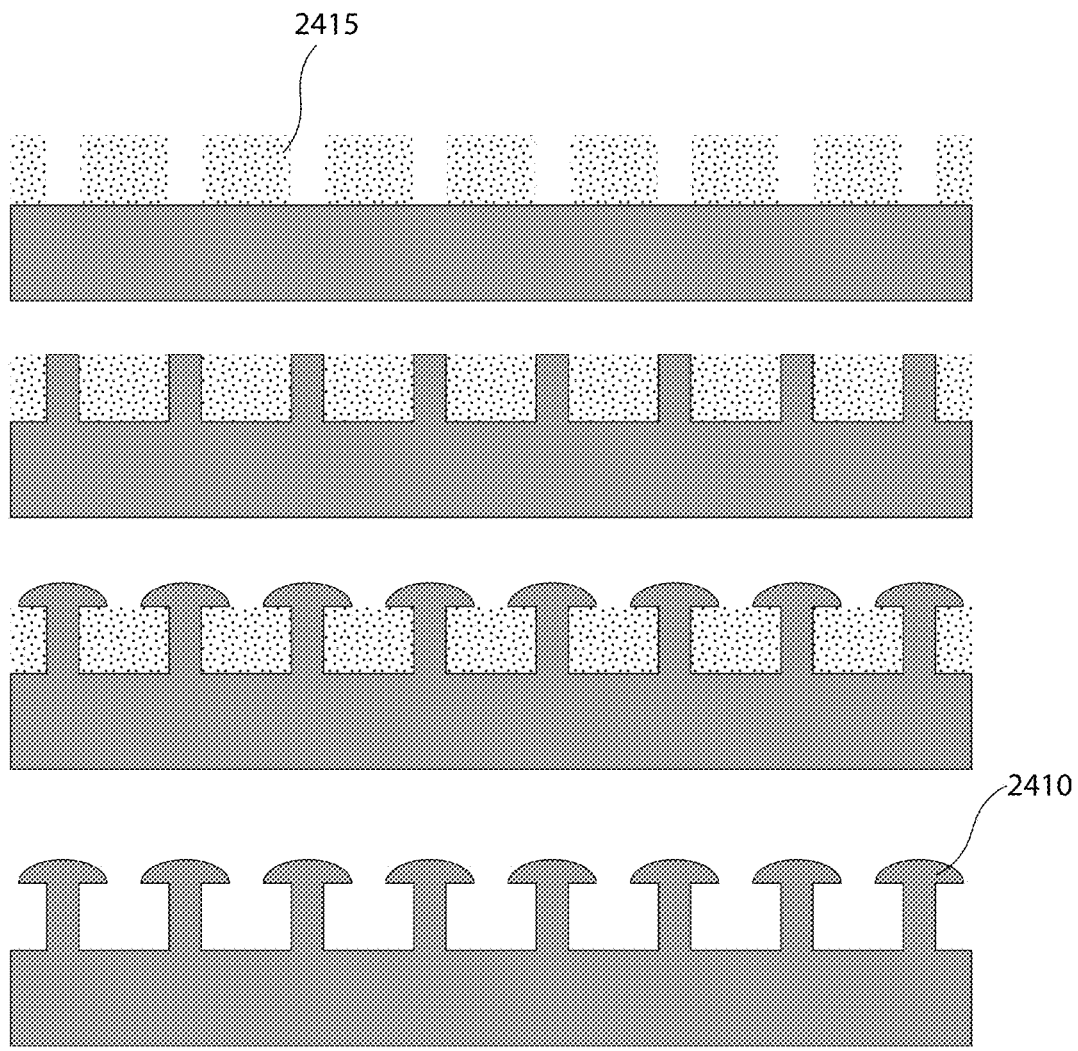
FIG. 24 illustrates a process for depositing a wick with an array of micropillars and caps according to some embodiments.

The caps can be formed, for example, in any number of ways such as, for example, by electroplating. In some embodiments, an array of micropillars and caps can include micro-scaled sacrificial spacers on a macro-scaled sacrificial layer. In some embodiments, an array of micropillars and caps can be electroplated through a template and allowing the "mushroom-cap" growth as shown in FIG. 24.

Figure 25:
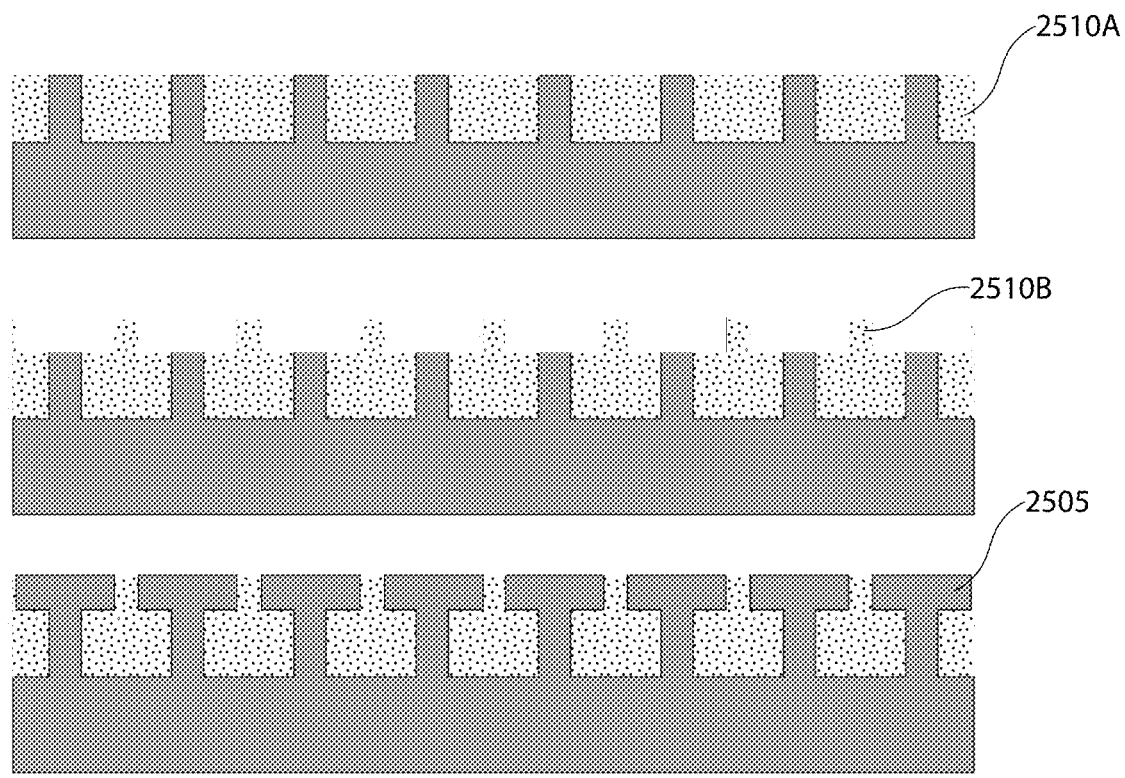
FIG. 25 illustrates a process for depositing a wick with an array of micropillars and caps according to some embodiments.

In some embodiments, an array of micropillars and caps can be electroplated through a 2-layer template, creating "T-caps" as in FIG. 25. This 2-layer template can be formed in a number of ways, for example, including first developing the first template layer, electroplating the pillars through to the top of the template, then disposing and developing the second template layer; alternatively, both template layers can be formed simultaneously out of a negative photoresist by depositing and photo-exposing the first layer, then depositing and photo-exposing the second layer, then developing both simultaneously, followed by plating through the 2-layer template; other methods include molding through a template or 3-D printing to form the 2-layer template.

Figure 26:
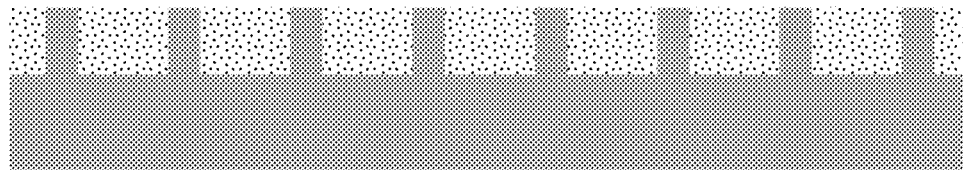
FIG. 26 illustrates a process for depositing a wick with an array of micropillars and caps according to some embodiments.
Figure 26:
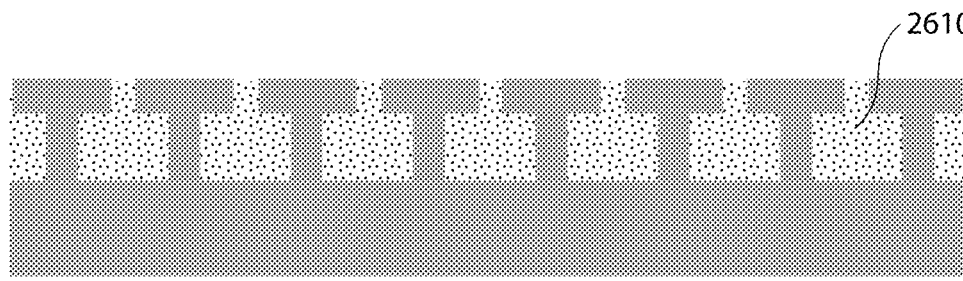
Figure 26:
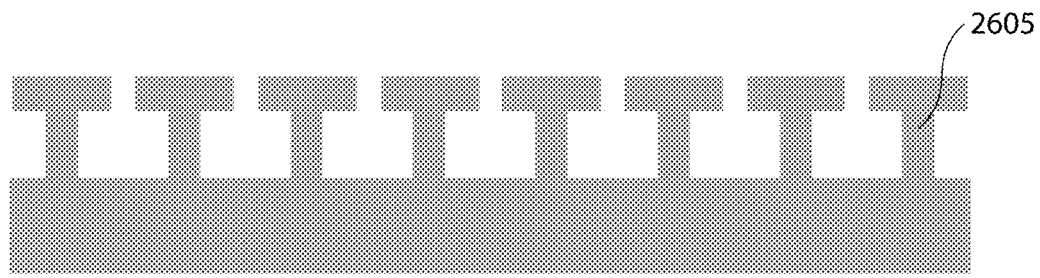

In some embodiments, the array of pillars with caps can be made by depositing and developing 2-layers of polymer or developable metal as shown in FIG. 26.

Figure 27:
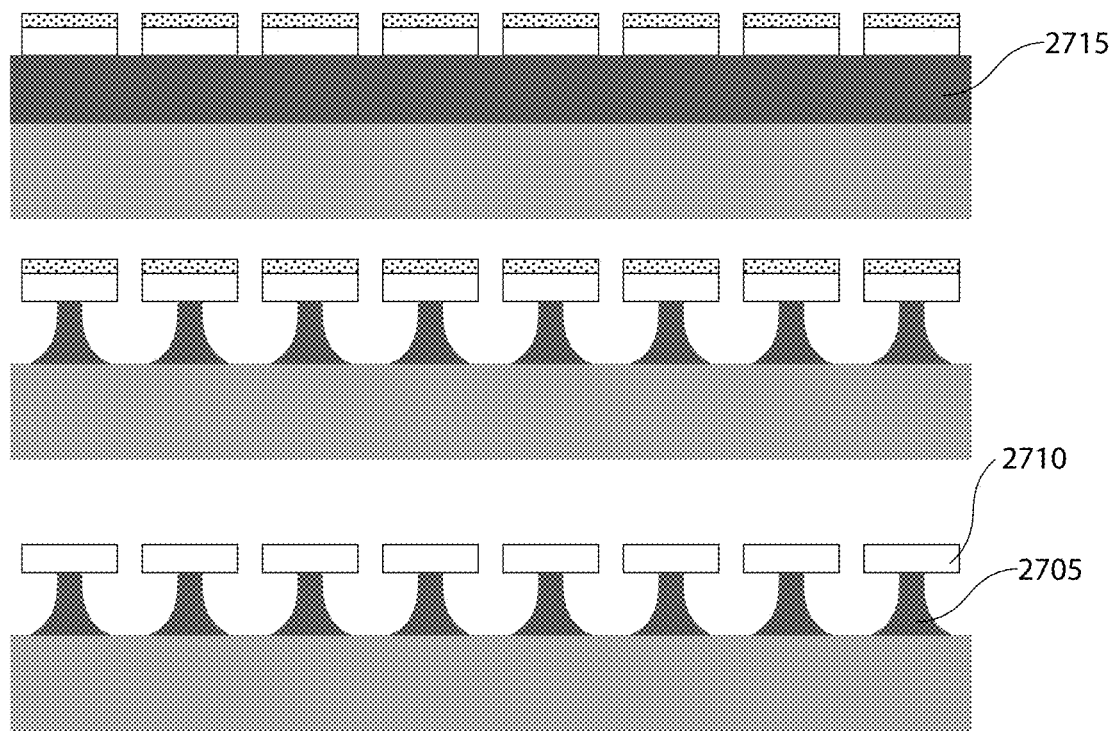
FIG. 27 illustrates a process for depositing a wick with an array of micropillars and caps according to some embodiments.

In some embodiments, an array of pillars and caps may be formed by undercutting an active layer as shown in FIG. 27. In some embodiments, the cap layer and the pillar layer may be the same material or different materials.

Figure 28:
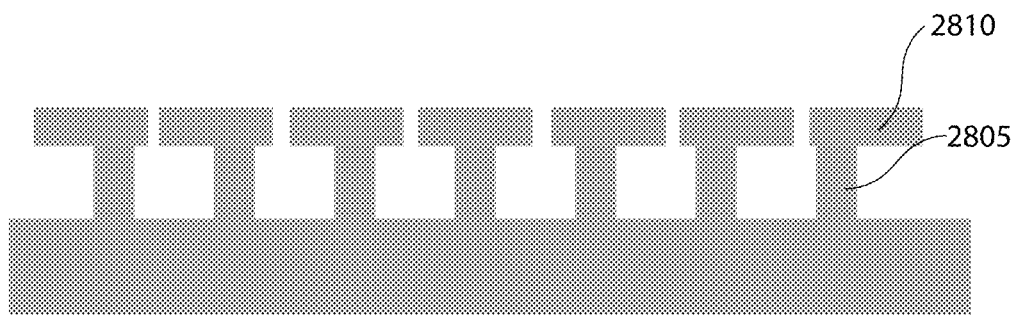
FIG. 28 illustrates a wick with an array of micropillars and non-aligned caps according to some embodiments.

In some embodiments, the cap layer and the pillar layer may be formed by separate etching processes: first a highly directional isotropic etch, followed by an anisotropic etch. The caps can be aligned to the underlying pillars, or misaligned as shown in FIG. 28.

In some embodiments, the caps may be deposited onto preformed pillars. In some embodiments, the caps can be formed as an array of metal on a polymer substrate which may be bonded to preformed pillars, after which the polymer may be removed. The pillars, for example, may be formed by chemically or mechanically etching. As another example, the pillars may be formed by templated plating, silk-screen printing, or 3D printing.

Figure 29:
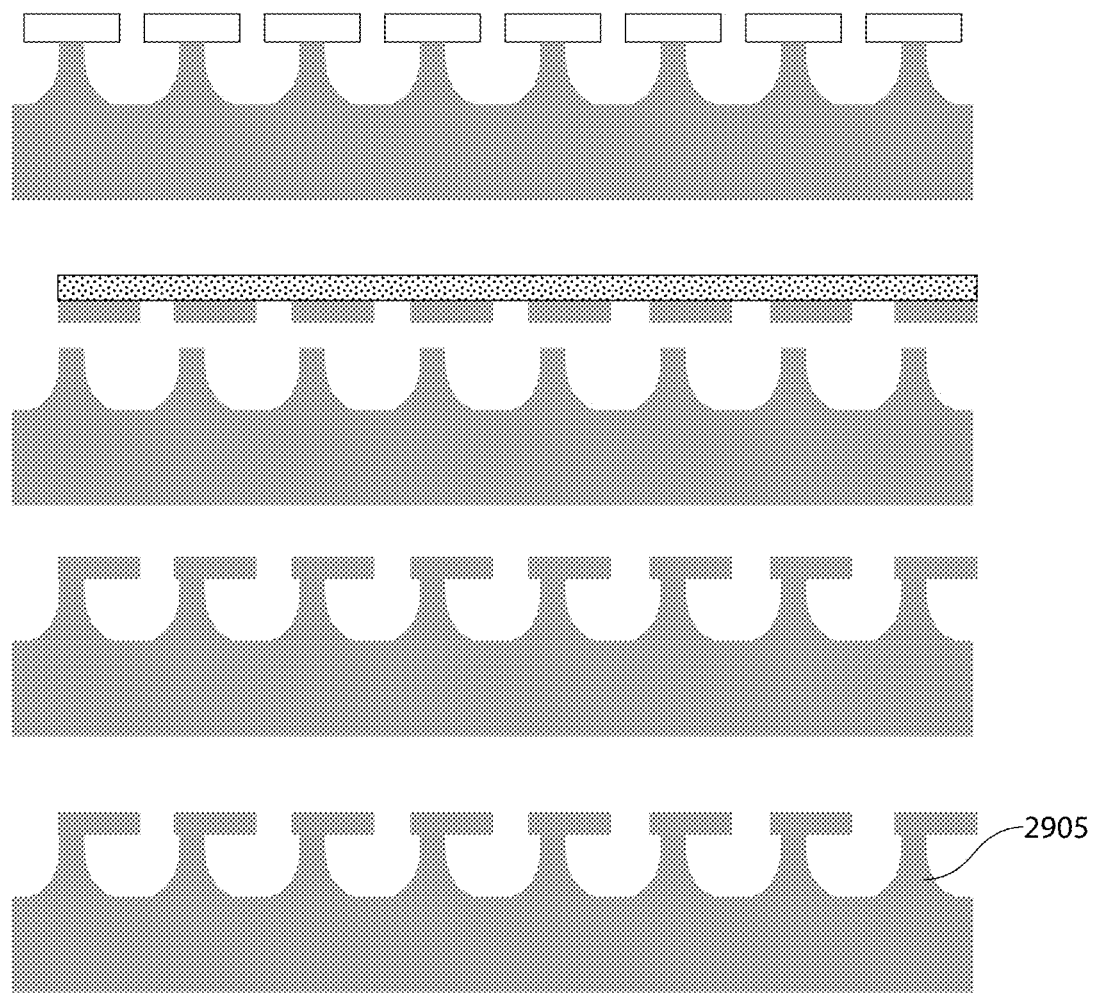
FIG. 29 illustrates pillars formed by a photopatterning and etching process according to some embodiments.

As another example, the pillars may be formed by a photopatterning and etching process as shown in FIG. 29.

Figure 30A:
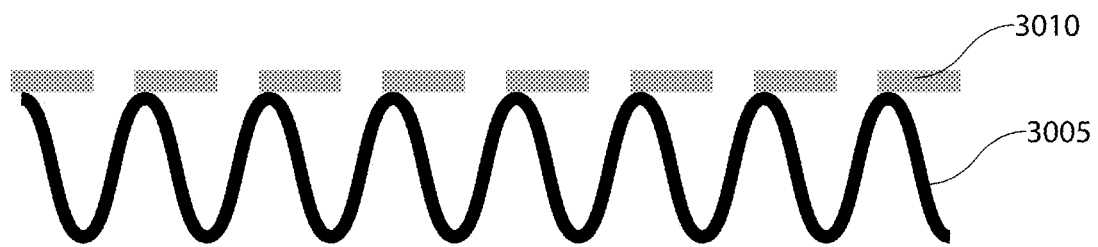
FIG. 30A illustrates pillars formed from a deformed substrate according to some embodiments.
Figure 30B:
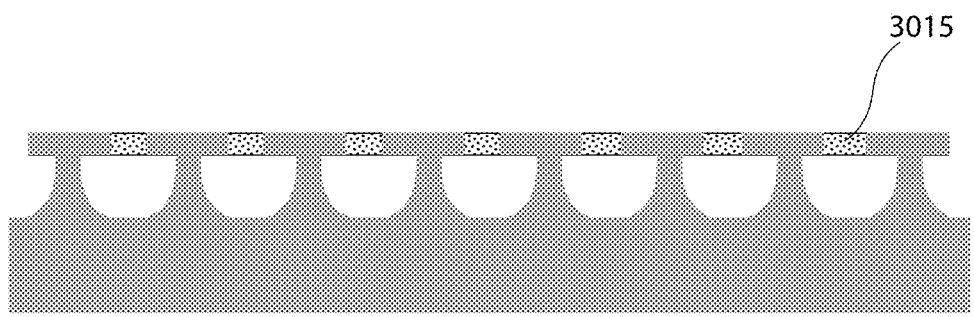
FIG. 30B illustrates pillars with porous materials between some gaps according to some embodiments.

As another example the pillars may be formed by deforming the substrate through a bending technique as shown in FIG. 30A. In some embodiments, the caps may be tethered to one another, for example, in order to maintain the small gap and high capillary pressure. In some embodiments, the gaps between the caps can be filled with a porous material, for example, to increase the capillary pressure, as shown in FIG. 30B. The porous material may include, for example, sintered micro/nano particles, inverse opal structure, porous anodized alumina, zeolites, etc.

In some embodiments, small pillars may have a thickness and/or height less than about 0.1 mm. In some embodiments, the gaps between the caps can be less than about 100 microns (e.g., 10 microns). In some embodiments, the vapor core may have pillars that are 1.0 mm in thickness and/or height. In some embodiments, the distance between pillars can be about 100 microns. In some embodiments, a pillar can be 50 microns tall. In some embodiments, a cap can be 25 microns tall. In some embodiments, a porous material (e.g., with a 0.1 microns pore size can be disposed within the gaps. In some embodiments, the distance between pillars can be roughly the same as the size (e.g., about 100 microns).

Figure 31A:
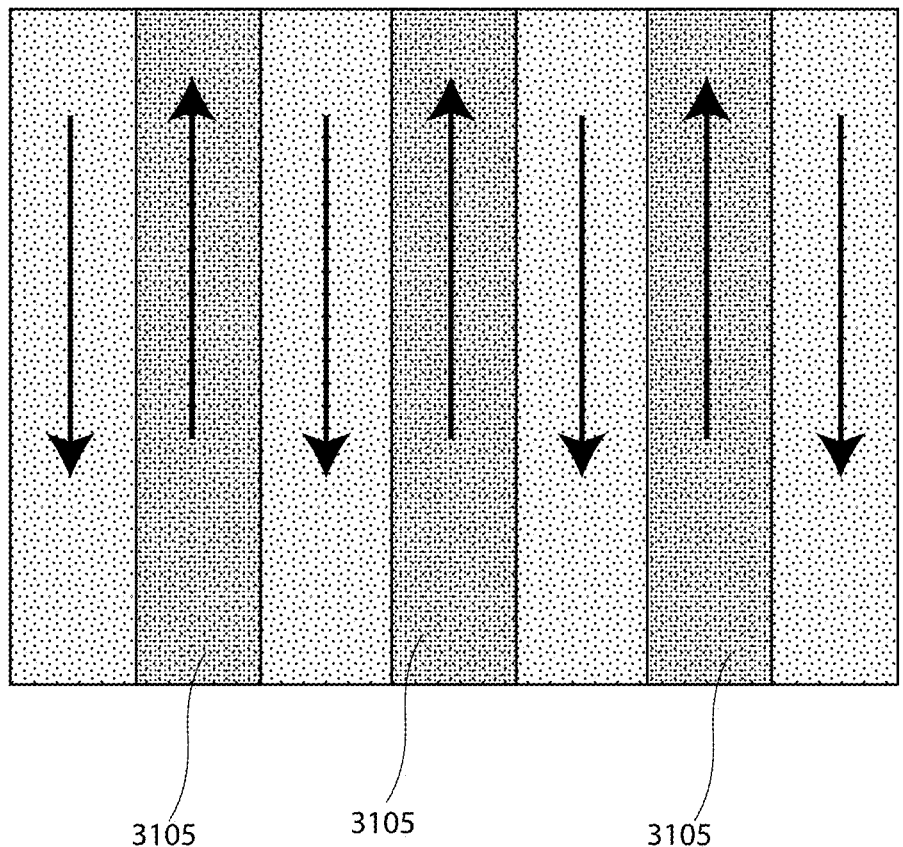
FIG. 31A illustrates a top view of a thermal management plane with an artery according to some embodiments.
Figure 31B:
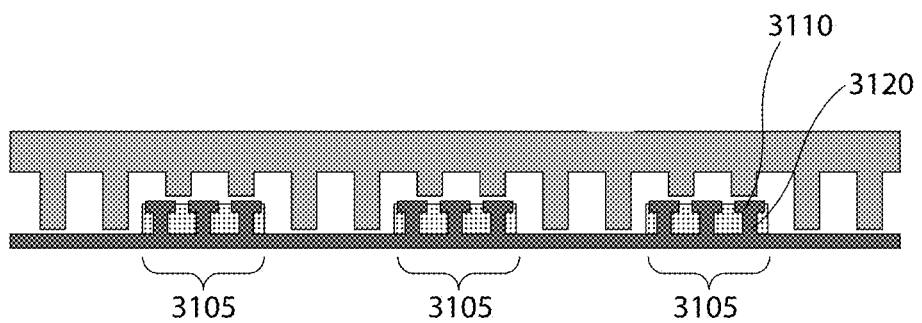
FIG. 31B illustrates a top view of a thermal management plane with an artery according to some embodiments.
Figure 32A:
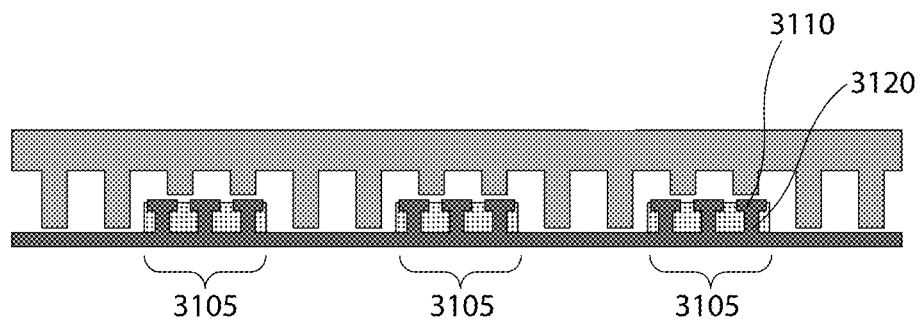
FIG. 32A illustrates a top view of a thermal management plane with an artery according to some embodiments.
Figure 32B:
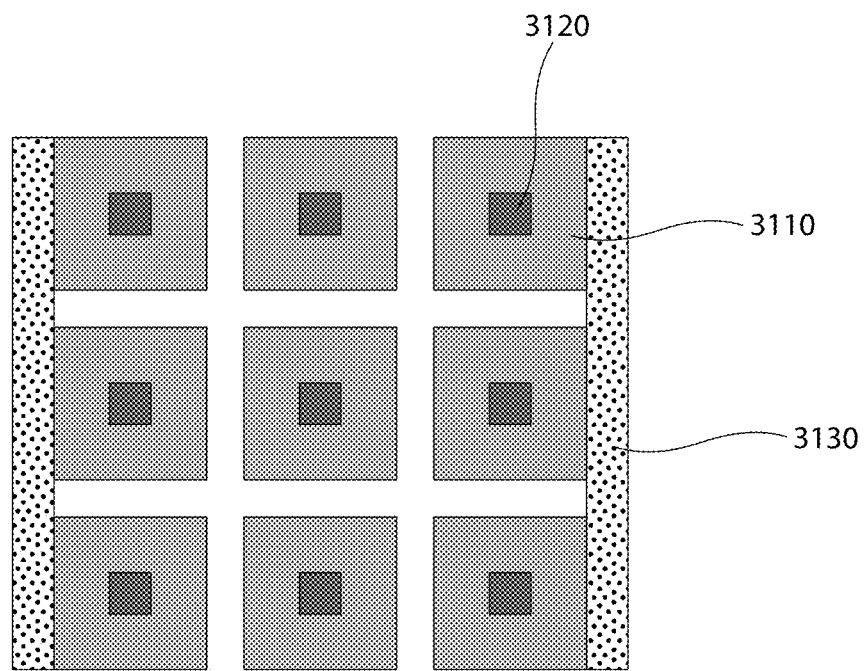
FIG. 32B illustrates a top view of a thermal management plane with an artery according to some embodiments.

In some embodiments, the wick may include an artery-type design. For example, arteries within the wick may be removed to increase the thickness of the vapor core in those regions as shown in FIG. 31A (top view) and FIG. 31B (side view). In some embodiments, arteries 3105 may include a thicker vapor core that may increase the effective thermal conductivity for a given thermal management plane thickness. A thicker vapor core may, for example, may be about 80-120 microns or about 100 microns. For example, the thickness of the vapor core can be increased from about 60 µm to about 100 µm or from about 150 µm to about 200 µm. In some embodiments, the arteries 3105 may include a plurality of pillars 3120 with caps 3110. In some embodiments, the sides of the wick region may also be capped with a high capillary pressure design, for example, so that a meniscus does not form along the side of the pillars 3120 and proceed underneath the caps 3110. This can be accomplished, for example, by replacing the pillars 3120 with an impermeable wall 3130 along the side of an artery 3105 as shown in FIG. 32A and FIG. 32B.

Figure 33A:
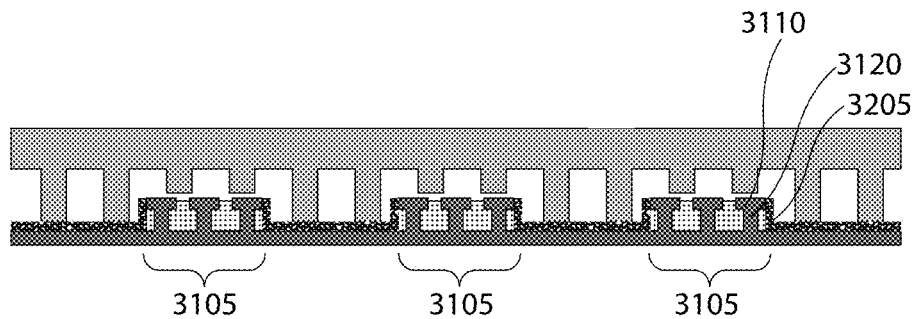
FIG. 33A illustrates a top view of a thermal management plane with an artery according to some embodiments.
Figure 33B:
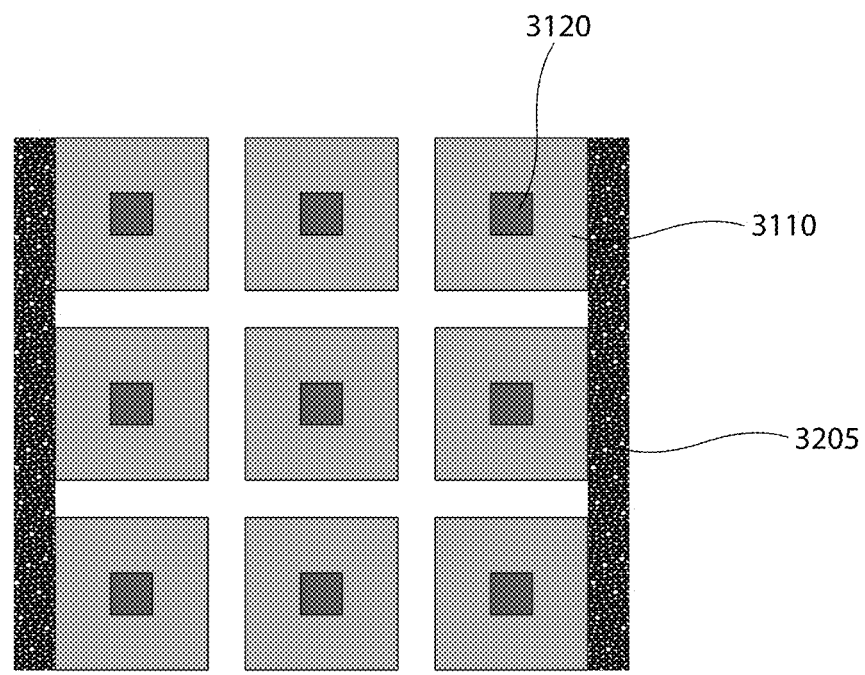
FIG. 33B illustrates a top view of a thermal management plane with an artery according to some embodiments.

Alternatively or additionally, a porous material such as sintered micro/nano particles, inverse opal structure, zeolites, porous anodized alumina etc., may be deposited along the side of an artery as shown in FIG. 33A and FIG. 33B. In some embodiments, the region below the vapor artery 3105 can include a porous material layer 3205 (e.g., sintered microparticles, inverse opal structures, zeolites, porous anodized alumina, micro-porous membrane material or nano-porous membrane material, etc.), for example, to facilitate communication of liquid pressures between adjacent arteries. The porous material layer 3205 can be disposed on the bottom casing or the top casing. In some embodiments, the porous material layer 3205 along the side of an artery 3105 can be formed by etching an artery channel pattern into bulk (e.g., thickness >1 mm) aluminum, and subsequently forming a thin porous anodized alumina layer (e.g., thickness <0.05 mm) along the channel walls, which is transferred to the wick.

Figure 34A:
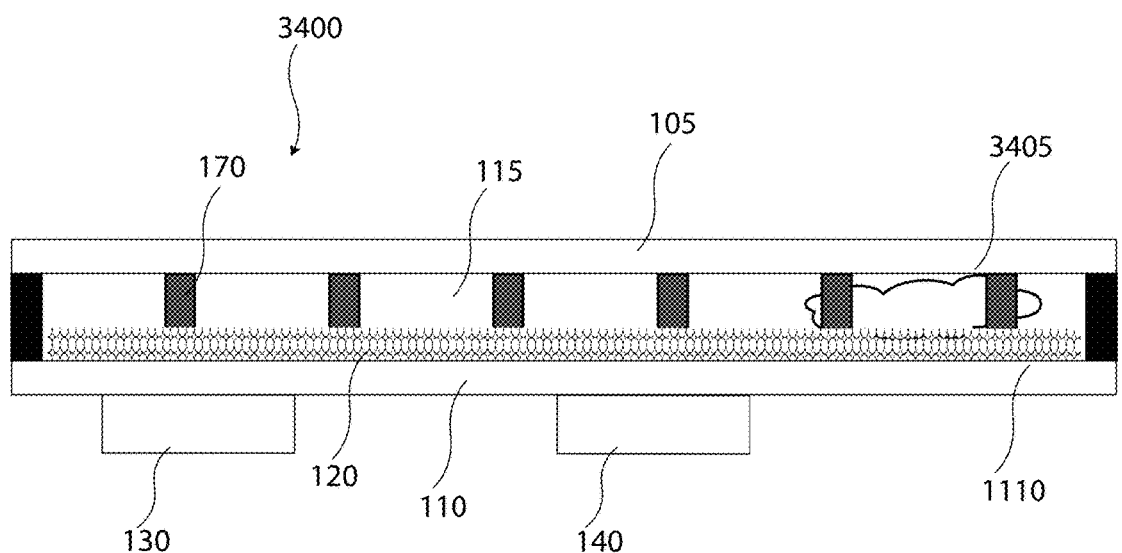
FIG. 34A illustrates a thermal management plane with a non-condensable gas reservoir according to some embodiments.
Figure 34B:
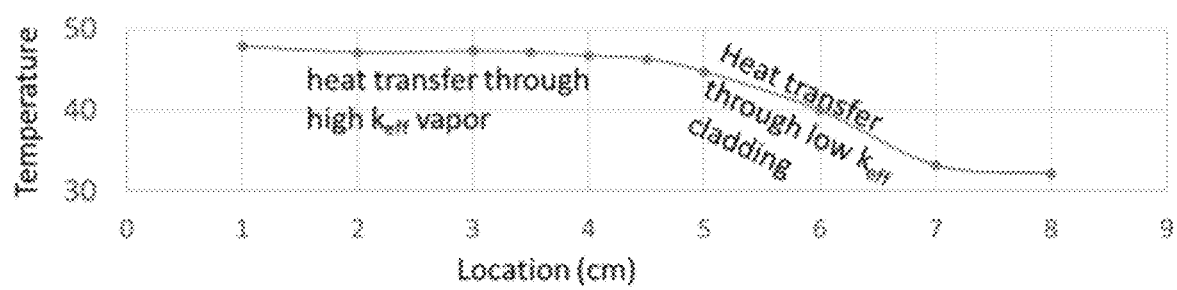
FIG. 34B is a graph of temperature distribution along heat transfer versus location on a thermal management plane with a non-condensable gas region according to some embodiments.

In some embodiments, a non-condensable gas reservoir 3405 can be placed in the vapor core of a thermal management plane 3400 as shown in FIG. 34A. If the non-condensable gas reservoir 3405, for example, occurs between the evaporator 130 and condenser 140, it may lead to regions of the thermal ground plane 3400 where vapor will not circulate. The effective thermal conductivity of the vapor core 115 in the regions where the non-condensable gas accumulates can be reduced as shown in FIG. 34B. The heat, for example, can travel through the top casing 105 and/or the bottom casing 110 rather than through the vapor core 115. In some embodiments, it can be beneficial to minimize the amount of non-condensable gas 3405 (by non-reactive hermetic sealing methods) and/or to reduce the volume filled by a given amount of non-condensable gas.

Figure 35A:
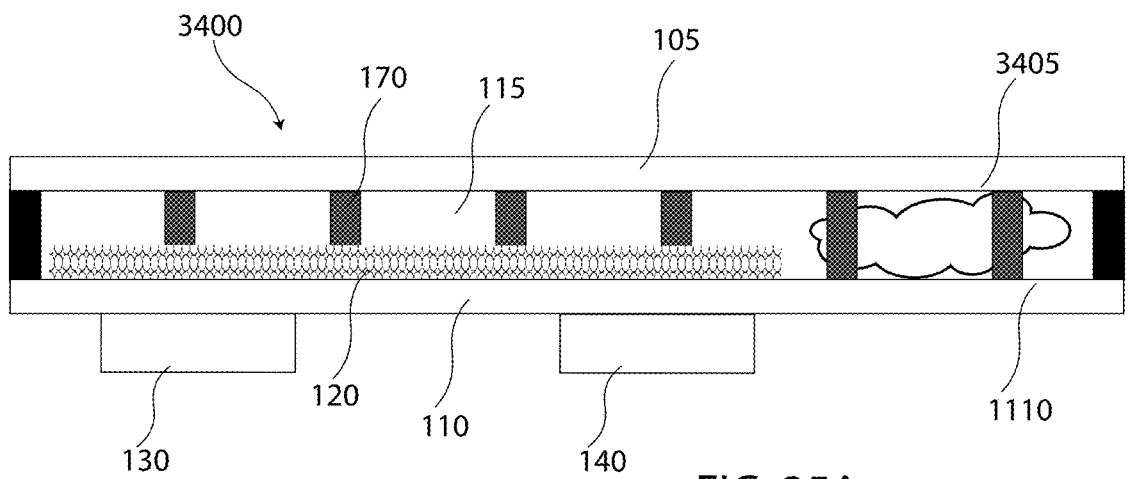
FIG. 35A illustrates a thermal management plane with a non-condensable gas reservoir gas according to some embodiments.
Figure 35B:
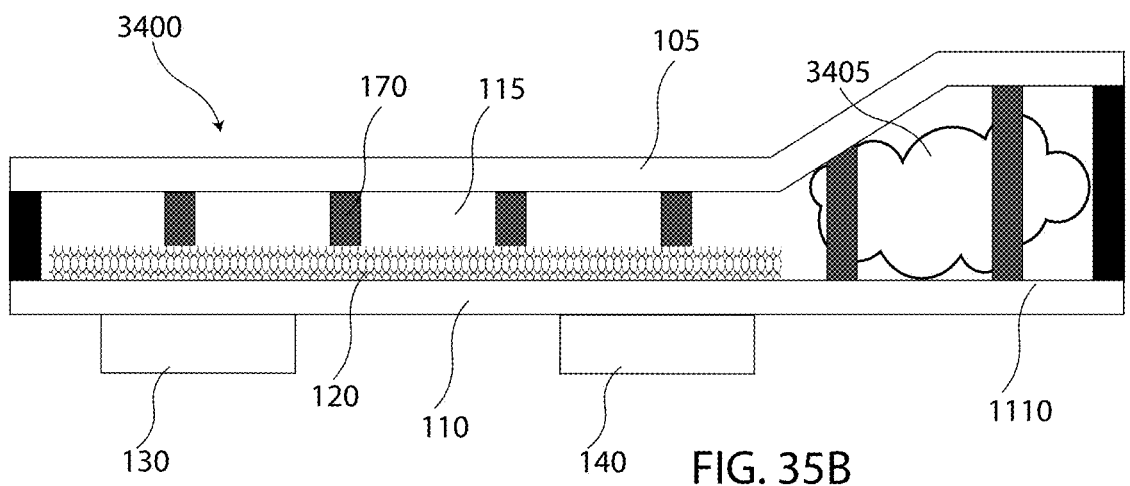
FIG. 35B illustrates a thermal management plane with a non-condensable gas reservoir gas according to some embodiments.
Figure 35C:
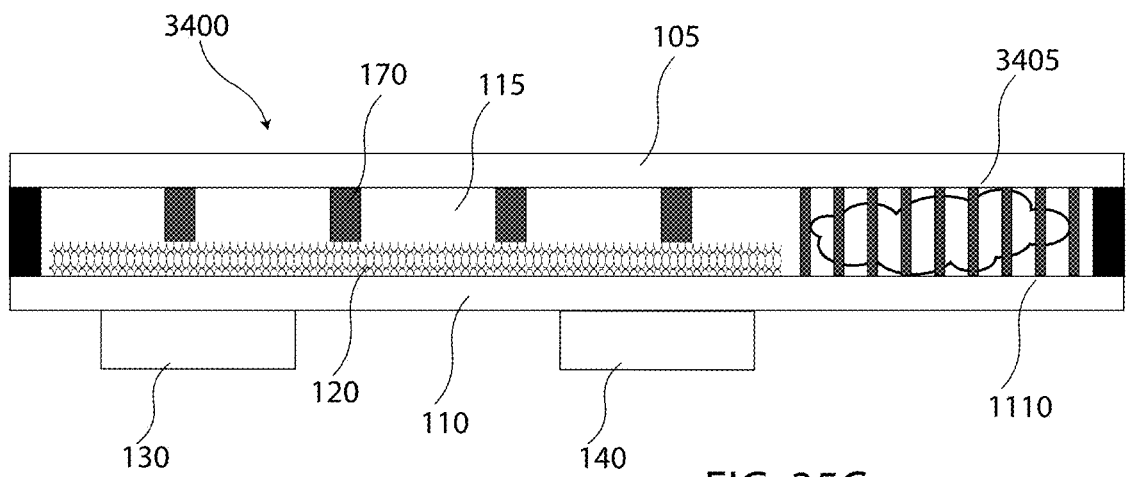
FIG. 35C illustrates a thermal management plane with a non-condensable gas reservoir gas according to some embodiments.

In some embodiments, the non-condensable reservoir 3405, for example, can include a volume designed to be filled with a non-compressible gas. In some embodiments, the reservoir volume can increase for a given thermal ground plane volume by eliminating the wick in the reservoir region as shown in FIG. 35A. In some embodiments, the reservoir volume can extend out-of-plane by extending the size of the support structure or bending the reservoir as shown in FIG. 35B. In some embodiments, the geometry of the support geometry can be changed to prevent the casing layers from collapsing compared to the active area, such that they optimize the volume available rather than the flow permeability as shown in FIG. 35C.

In some embodiments, it may be desirable to control the effective thermal conductivity of the thermal ground plane. This can be achieved, for example, by actively controlling the volume of the non-condensable gas reservoir. For example, increasing the volume of the non-condensable gas reservoir will reduce active the area that is filled by non-condensable gas, increasing the active area filled with high effective-conductivity vapor, and thereby increasing the overall effective thermal conductivity of the thermal ground plane. Reducing the volume of the non-condensable gas reservoir, for example, conversely decreases the effective thermal conductivity of the thermal ground plane.

Figure 36A:
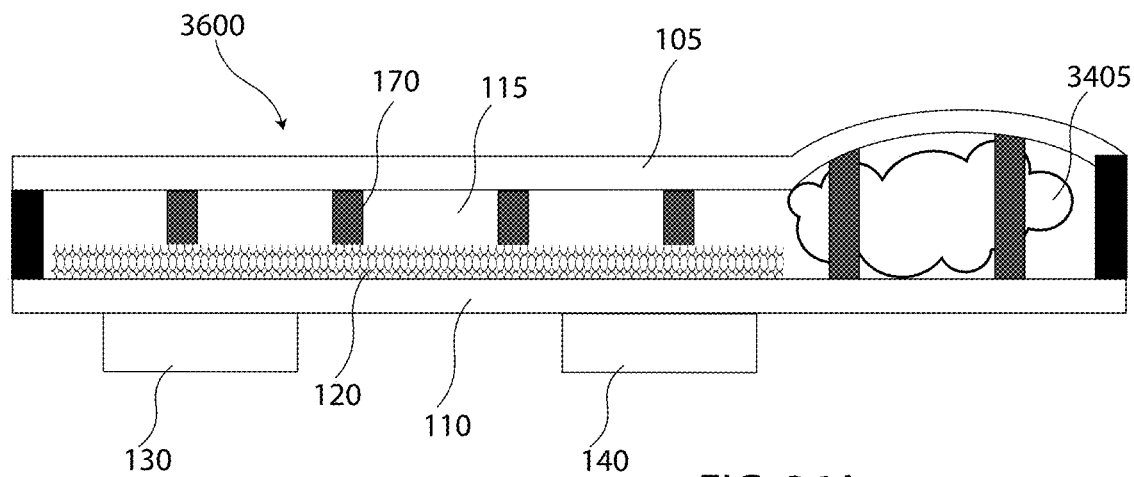
FIG. 36A illustrates a thermal management plane with a non-compressible gas according to some embodiments.
Figure 36B:
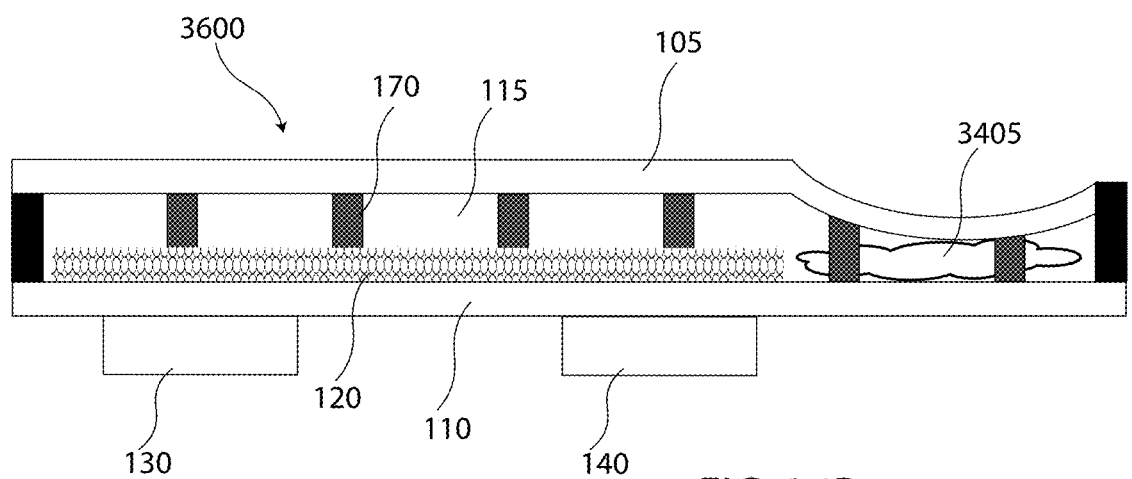
FIG. 36B illustrates a thermal management plane with a non-compressible gas according to some embodiments.

In some embodiments, control of the volume of a non-condensable gas reservoir in a thermal ground plane 3600 can be achieved by, for example, with a piezo bender as shown in FIG. 36A and FIG. 36B, or other actuators. In some embodiments, the volume control can be achieved by passive actuation, such as, for example, using a thermal bimorph membrane of two materials with different coefficients of thermal expansion. In some embodiments, the design can be such that the reservoir volume expands as the temperature increases, or such that the volume decreases as the temperature increases. One of the layers of the bimorph may include a phase-change material such that the actuation is triggered by crossing a specific melting temperature.

In some embodiments, the amount of liquid in the thermal ground plane may have an effect on the performance of the thermal ground plane. In some embodiments, less liquid may mean the thickness of the liquid layer can be thinner and/or flow-area decreases, the speed of the liquid might increase, and the viscous pressure drop of the liquid may increase. In some embodiments, too much liquid will overfill the wick, and use area in the vapor core, reducing the vapor transport effectiveness. In general, there can be a trade-off between higher maximum power and lower effective thermal conductivity at high water-charge, and lower maximum power with higher effective thermal conductivity at low water-charge. In some embodiments, control of the liquid filling fraction can be challenging if there are processing variations in fabrication of the wick. In some embodiments, a liquid buffer volume can be included such that the wick capillary pressure may determine the fraction of water filling the wick, regardless of amount of water in the thermal ground plane.

Figure 37A:
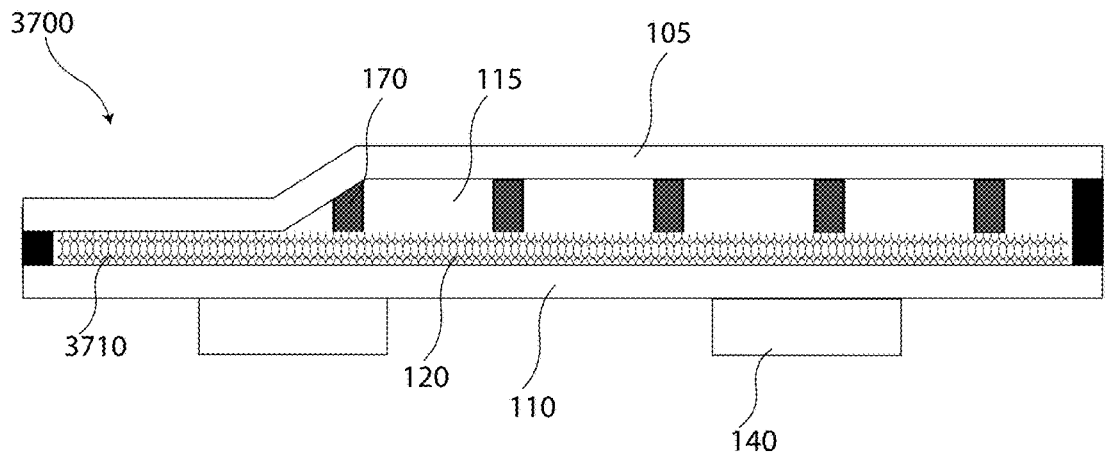
FIG. 37A illustrates a thermal management plane with a buffer volume without vapor cavity according to some embodiments.

In some embodiments, a thermal ground plane 3700 may include a buffer volume 3710 that includes a region of wick 120 without a vapor cavity as shown in FIG. 37A.

Figure 37B:
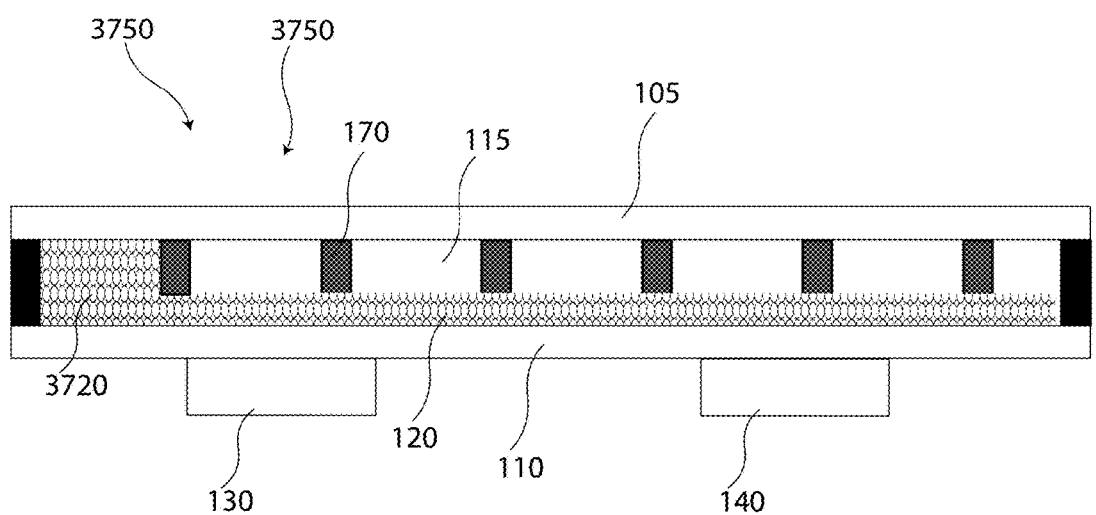
FIG. 37B illustrates a thermal management plane with a buffer volume without a vapor cavity according to some embodiments.

In some embodiments, a thermal ground plane 3750 may include a buffer volume 3720 that includes a region of extended wick 120 as shown in FIG. 37B.

In some embodiments, a thermal ground plane may include a buffer volume that can include an empty region separated from the thermal ground plane by a permeable barrier.

Figure 38A:
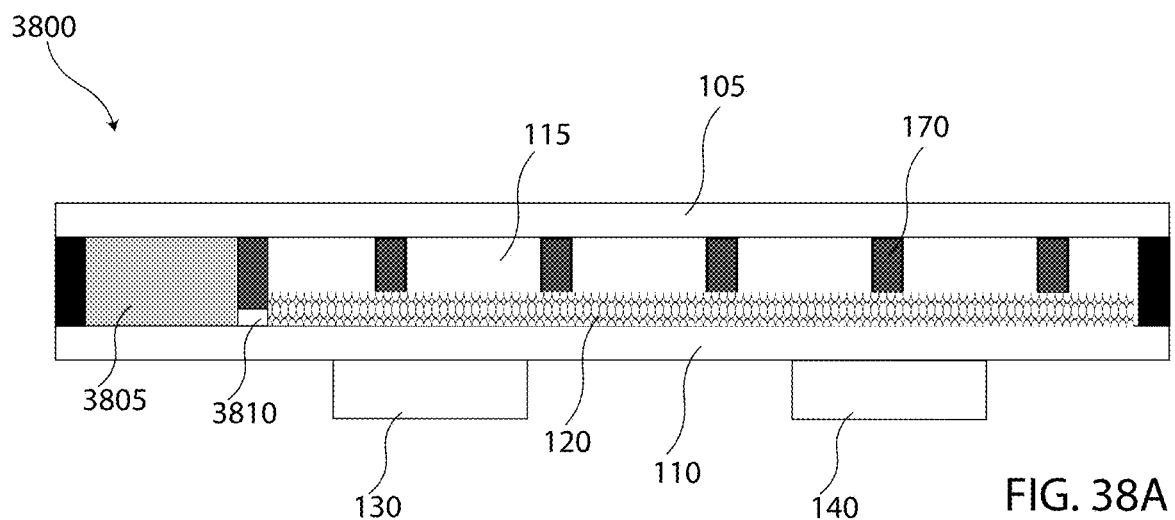
FIG. 38A illustrates a thermal management plane with a buffer volume according to some embodiments.

In some embodiments, a thermal ground plane 3800 may include a buffer volume 3805 as shown in FIG. 38A. A porous separator 3810 may be used to separate the buffer volume 3805 and the vapor core 115.

Figure 38B:
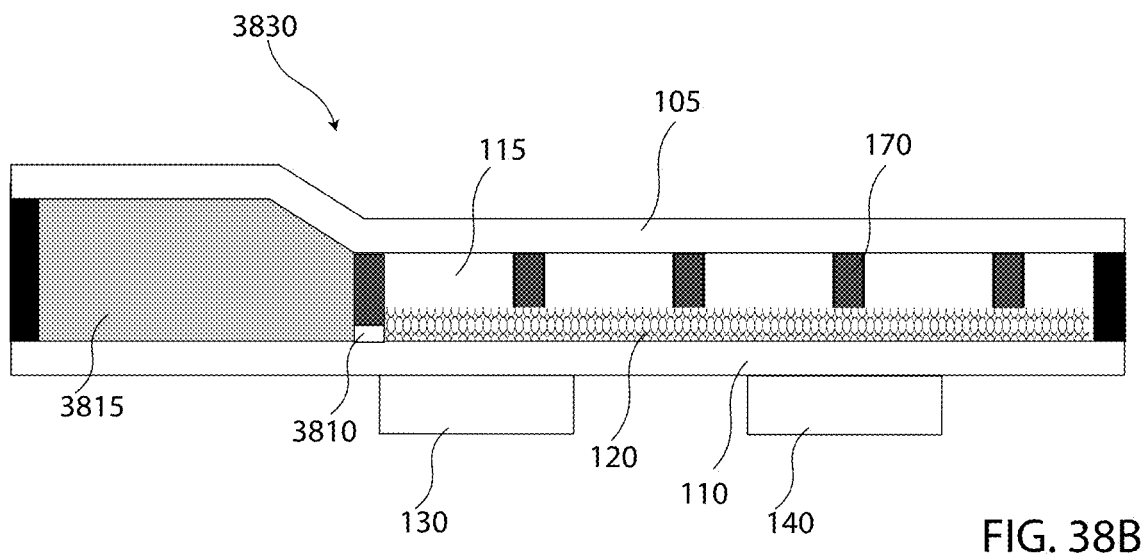
FIG. 38B illustrates a thermal management plane with a buffer volume according to some embodiments.

In some embodiments, a thermal ground plane 3830 may include a buffer volume 3815 as shown in FIG. 38B. A porous separator 3810 may be used to separate the buffer volume 3815 and the vapor core 115.

Figure 38C:
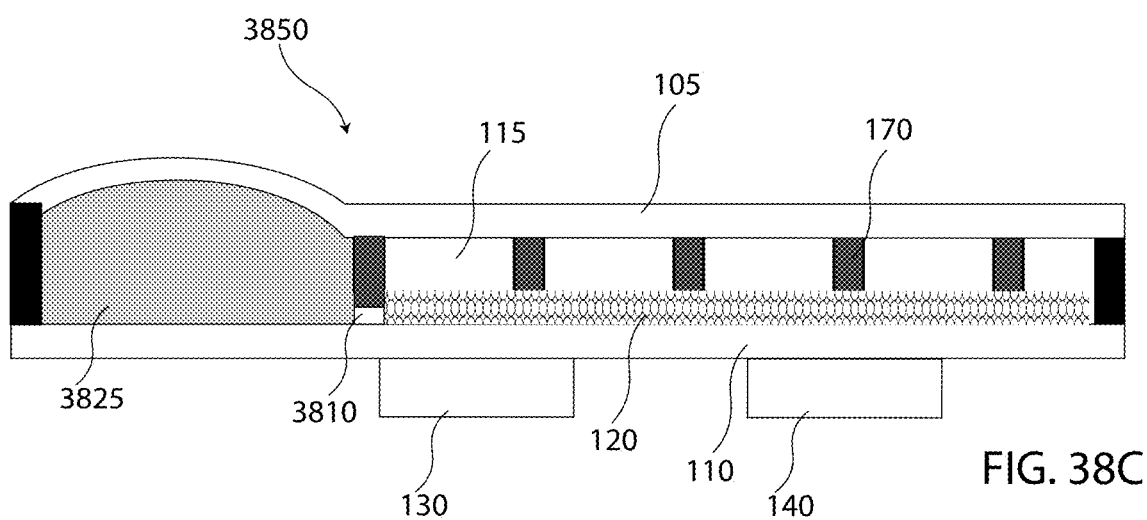
FIG. 38C illustrates a thermal management plane with a buffer volume according to some embodiments.

In some embodiments, a thermal ground plane 3850 may include a buffer volume 3825 that can be actively controlled with a mechanical actuator (e.g., piezo bender) as shown in FIG. 38C. In some embodiments, the maximum power could be reduced to increase the effective thermal transport of the vapor, and/or maximum power should be increased at the expense of the effective thermal transport of the vapor. The actuation, for example, can be passively controlled such as with a thermal bimorph including a phase change material (PCM)-based thermal bimorph.

In some embodiments, a fluid optimized for the heat transfer can be used in a thermal ground plane. A method for optimizing the fluid can include: 1) selecting fluid candidates, 2) determining fluid thermophysical properties, 3)

computing maximum power and effective thermal conductivity for a given operating temperature and wick and vapor geometric designs, 4) varying the geometric designs within a pre-defined parameter space subject to such constraints as total cavity thickness, capillary radius within a wick, maximum aspect ratio of structures feasible with fabrication techniques, etc., in order to determine the maximum power and thermal conductivity of an optimized design, 5) selecting the fluid candidate which has the best optimized performance according to step 4. By this method, for example, both the geometry and fluid can be simultaneously optimized. The fluids in question may include solvents such as water, methanol, ethanol, isopropanol, n-butanol, isobutanol, acetone, etc.; refrigerants such as ammonia; artificial fluids such as perfluorocarbons, fluoroacrylates, etc.; or azeotropic mixtures of different fluids.

Some embodiments include a thermal management plane comprising: a first planar substrate member (top casing); a second planar substrate member (bottom casing); and configured by hermetic seal to enclose a vacuum core in conjunction with the first planar substrate; and a distribution of spacers separating the vacuum core and the first planar substrate member and the second planar substrate member, wherein the spacers are designed to reach extremely low or high thermal conduction.

In some embodiments, the thermal management plane may include a composite of metallic and dielectric layers. In some embodiments, the dialectic layers may be plugged by electroplating through the metallic layer. In some embodiments, the dielectric layers may be plugged by sintering nanoparticles selectively deposited to the pinholes through their functionalized hydrophobic tails.

In some embodiments, the hermetic seal may be made by sintering nanoparticles along the perimeter of a thermal management plane. In some embodiments, the sintering nanoparticles may be applied to a number of thermal management planes simultaneously. In some embodiments, the nanoparticles may include copper nanoparticles, silver nanoparticles or other metallic nanoparticles with sintering temperatures substantially reduced.

In some embodiments, the hermetic seal may be made for the thermal management plane being conformed to a non-planar configuration.

In some embodiments, the second planar substrate can be made of ceramic, glass or other hermetic materials. In some embodiments, the second planar substrate element can be made with a wavy structure.

In some embodiments, the spacers may include a low-thermal conductivity ceramic, glass or other inorganic structure disposed on a substrate. In some embodiments, the spacers may be fabricated by stamping, etching or molding. In some embodiments, the spacers may comprise a polymer structure encapsulated by an inorganic, hermetic layer formed by atomic layer deposition, molecular layer deposition, chemical vapor deposition, physical vapor deposition, sol-gel, electroplating, electroless plating or lamination.

In some embodiments, the vacuum core can be enhanced with a getter absorbing gases or vapors. In some embodiments, the vacuum core can be enhanced with atomic layer deposition and molecular layer deposition using the core as the deposition chamber. In some embodiments, the deposition can be applied to a number of thermal management planes simultaneously. In some embodiments, the vacuum core can be replaced by a vapor core and a wicking layer filled with liquid to form a thermal ground plane.

In some embodiments, the thermal management plane can comprise vacuum thermal insulators and thermal ground planes.

In some embodiments, the thermal management plane can comprise a capped wick structure with a lower section for effective liquid transport and an upper section for effective evaporation. In some embodiments, the capped wick structure can be made by electroplating through a template configured with micro-scaled sacrificial spacers disposed on a macro-scaled sacrificial layer. In some embodiments, the capped wick structure can be made by a 2-step etching process of isotropic and anisotropic etching. In some embodiments, the capped wick structure can be made by bonding a pre-patterned array for caps with a pre-patterned array of pillars. In some embodiments, the capped wick structure can be made with mechanical support between the caps by tethers or micro/nano-porous material. In some embodiments, the capped wick structure can be designed with arteries for effective liquid and vapor transport. In some embodiments, the capped wick structure can comprise a gas reservoir to collect non-condensable gases. In some embodiments, the capped wick structure can be controlled with active means. In some embodiments, the capped wick structure can comprise a liquid reservoir to store liquid in the wick structure.

In some embodiments, the liquid reservoir can be controlled with active means.

Unless otherwise specified, the term "substantially" means within 5% or 10% of the value referred to or within manufacturing tolerances. Unless otherwise specified, the term "about" means within 5% or 10% of the value referred to or within manufacturing tolerances.

The use of "adapted to" or "configured to" in this document is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A thermal ground plane comprising:
    a top casing;
    a bottom casing;
    a seal between the top casing and the bottom casing;
    a working fluid disposed within the thermal ground plane;
    a wicking layer disposed between the top casing and the bottom casing;
    a vapor core disposed within the thermal ground plane; and
    a wall disposed on a side of the wicking layer and disposed between the top casing and the bottom casing.

2. The thermal ground plane according to claim 1, wherein the wall is impermeable.

3. The thermal ground plane according to claim 1, wherein the wall comprises a porous material.

4. The thermal ground plane according to claim 1, further comprising one or more arteries within the wicking layer.

5. The thermal ground plane according to claim 1, wherein the wicking layer comprises a plurality of pillars.

6. The thermal ground plane according to claim 1, wherein the wicking layer comprises a mesh.

7. The thermal ground plane according to claim 1, wherein the wicking layer is etched into the bottom layer.

8. The thermal ground plane according to claim 1, further comprising a plurality of support structures placed between the top casing and the bottom casing.

9. The thermal ground plane according to claim 1, further comprising an isolated vacuum cavity disposed within the thermal management plane.

10. The thermal ground plane according to claim 1, further comprising a plurality of spacers disposed between the top casing and the bottom casing and the plurality of spacers comprising a low-thermal conductivity material.

11. The thermal ground plane according to claim 1, wherein the top casing comprises a non-copper layer encapsulated with a copper layer.

12. The thermal ground plane according to claim 1, wherein the top casing comprises a polymer encapsulated with a copper layer.

13. A thermal ground plane comprising:
  a top casing comprising a polymer material;
  a top encapsulation layer disposed on the top casing;
  a bottom casing comprising a polymer material;
  a bottom encapsulation layer disposed on the bottom casing;
  a hermetical seal coupling the bottom casing with the top casing;
  a wicking layer disposed between the bottom casing and the top casing; and
  a wall disposed on a side of the wicking layer and disposed between the top casing and the bottom casing.

14. The thermal ground plane according to claim 13, wherein the hermetical seal comprises sintered nanoparticles along a perimeter of either or both the top casing and the bottom casing.

15. The thermal ground plane according to claim 13, wherein the top encapsulation and/or the bottom encapsulation comprises copper.

16. The thermal ground plane according to claim 13, wherein the wicking layer comprises a plurality of pillars where the pillars include a cap.

17. The thermal ground plane according to claim 13, wherein the wicking layer comprises a pre-patterned array of caps and/or a pre-patterned array of pillars.

18. The thermal ground plane according to claim 13, further comprising a plurality of arteries.

19. The thermal ground plane according to claim 13, further comprising a gas reservoir to collect non-condensable gases.

20. The thermal ground plane according to claim 13, further comprising a vapor core disposed within the thermal ground plane.

* * * * *